(12) United States Patent
Beyer et al.

(10) Patent No.: US 9,436,080 B2
(45) Date of Patent: Sep. 6, 2016

(54) METHOD AND APPARATUS FOR CORRECTING ERRORS ON A WAFER PROCESSED BY A PHOTOLITHOGRAPHIC MASK

(75) Inventors: Dirk Beyer, Weimar (DE); Vladimir Dmitriev, Karmiel (IL); Ofir Sharoni, Karkur (IL); Nadav Wertsman, Ein Hod (IL)

(73) Assignees: Carl Zeiss SMS GmbH, Jena (DE); Carl Zeiss SMS Ltd., Karmiel (IL)

( * ) Notice: Subject to any disclaimer, the term of this patent is extended or adjusted under 35 U.S.C. 154(b) by 410 days.

(21) Appl. No.: 13/994,556

(22) PCT Filed: Dec. 2, 2011

(86) PCT No.: PCT/EP2011/071654

§ 371 (c)(1),
(2), (4) Date: Oct. 25, 2013

(87) PCT Pub. No.: WO2012/080008

PCT Pub. Date: Jun. 21, 2012

(65) Prior Publication Data

US 2014/0036243 A1 Feb. 6, 2014

Related U.S. Application Data

(60) Provisional application No. 61/424,422, filed on Dec. 17, 2010.

(51) Int. Cl.
*G03B 27/68* (2006.01)
*G03B 27/62* (2006.01)
(Continued)

(52) U.S. Cl.
CPC . *G03F 1/72* (2013.01); *G03F 1/84* (2013.01); *G03F 7/70466* (2013.01); *G03F 7/70625* (2013.01); *G03F 7/70633* (2013.01)

(58) Field of Classification Search
CPC .............. G03F 1/70; G03F 1/72; G03F 1/84; G03F 7/70466; G03F 7/70516; G03F 7/70625; G03F 7/70633; G03F 7/7065; G03F 7/70666; G03F 7/70675; G03F 7/70683
USPC ............... 355/46, 52, 53, 55, 67–71, 75–77; 250/492.1, 492.2, 492.22, 493.1, 548; 430/5, 8, 22, 30, 311, 312, 396; 716/54
See application file for complete search history.

(56) References Cited

U.S. PATENT DOCUMENTS

| | | |
|---|---|---|
| 7,001,697 B2 | 2/2006 | Park et al. |
| 7,241,539 B2 | 7/2007 | Kim et al. |

(Continued)

FOREIGN PATENT DOCUMENTS

| | | |
|---|---|---|
| DE | 102006054820 | 5/2008 |
| EP | 0628806 A2 | 12/1994 |

(Continued)

OTHER PUBLICATIONS

International Search Report and Written Opinion for corresponding application PCT/EP2011/071654 dated Jun. 12, 2012.

(Continued)

*Primary Examiner* — Christina Riddle
(74) *Attorney, Agent, or Firm* — Fish & Richardson P.C.

(57) ABSTRACT

The invention relates to a method for correcting at least one error on wafers processed by at least one photolithographic mask, the method comprises: (a) measuring the at least one error on a wafer at a wafer processing site, and (b) modifying the at least one photolithographic mask by introducing at least one arrangement of local persistent modifications in the at least one photolithographic mask.

19 Claims, 20 Drawing Sheets

(51) Int. Cl.
*G03F 1/72* (2012.01)
*G03F 1/84* (2012.01)
*G03F 7/20* (2006.01)

(56) References Cited

U.S. PATENT DOCUMENTS

| | | | |
|---|---|---|---|
| 7,459,242 | B2 | 12/2008 | Zait et al. |
| 2002/0111038 | A1* | 8/2002 | Matsumoto ......... G03F 7/70458 438/763 |
| 2003/0034570 | A1* | 2/2003 | Baggenstoss ........... G03F 1/144 257/797 |
| 2004/0147121 | A1* | 7/2004 | Nakagaki ............ G03F 7/70683 438/689 |
| 2006/0234139 | A1 | 10/2006 | Watson et al. |
| 2006/0236294 | A1* | 10/2006 | Saidin ..................... G03F 1/144 700/110 |
| 2007/0065729 | A1 | 3/2007 | Zait et al. |
| 2007/0224522 | A1 | 9/2007 | Lee et al. |
| 2008/0305636 | A1* | 12/2008 | Kim .................... H01L 21/0337 438/696 |
| 2009/0168034 | A1* | 7/2009 | Staecker ............. G03F 7/70633 355/46 |
| 2012/0009511 | A1* | 1/2012 | Dmitriev ................. G03F 1/72 430/5 |

FOREIGN PATENT DOCUMENTS

| | | | |
|---|---|---|---|
| EP | 1829052 B1 | 4/2008 | |
| JP | 2004-133456 | 4/2004 | ............... G03F 1/08 |
| JP | 2010-152031 | 7/2010 | ............... G03F 1/08 |

OTHER PUBLICATIONS

Schulz et al., "Meeting overlay requirements for future technology nodes with in-die overlay metrology," Proc. SPIE vol. 6518, 2007.

Oshemkov et al., "DUV Attenuation Structures in Fused Silica Induced Ultrashort Laser Radiation", Proc. CLEOE-IQEC, Munich 2007.

Reimer, "Scanning Electron Microscopy: Physics of Image Formation and Microanalysis," Springer Series in Optical Sciences, 2nd edition, Springer Verlag (1998), pp. 101-106; 138-142; and 148-152.

P. Zimmerman "Double Patterning Lithography; double the trouble or double the fun?" SPIE Newsroom, Jul. 20, 2009.

Towards 3nm overlay and critical dimension uniformity: an integrated error budget for double patterning lithography by W. A. Arnold; Proc. of SPIE vol. 6924 692404-1.

* cited by examiner

METHOD AND APPARATUS FOR CORRECTING ERRORS ON A WAFER PROCESSED BY A PHOTOLITHOGRAPHIC MASK

CROSS-REFERENCE TO RELATED APPLICATIONS

This application is a national stage application of PCT/EP2011/071654, filed on Dec. 2, 2011, which claims priority to U.S. Provisional Application 61/424,422, filed on Dec. 17, 2010. The contents of the above applications are herein incorporated by reference in their entirety.

1. FIELD OF THE INVENTION

The present invention relates to the field of correcting errors on a wafer processed by a photolithographic mask.

2. BACKGROUND OF THE INVENTION

As a result of the shrinking sizes of integrated circuits, photolithographic masks or templates of the nanoimprint lithography have to project smaller and smaller structures onto a photosensitive layer, i.e. a photo resist dispensed on a wafer. In order to fulfil this demand, the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photo resist on wafers. In order to increase the resolution of the photolithographic exposure system water is often used as immersion liquid between the projection objective and the wafer. As a consequence, the manufacturing of photolithographic masks with increasing resolution is becoming more and more complex, and thus more and more expensive as well. In the future, photolithographic masks will use significantly smaller wavelengths in the extreme ultraviolet (EUV) wavelength range of the electromagnetic spectrum (approximately at 13.5 nm). Double patterning lithography is bridging the gap between water-based 193 nm immersion lithography and EUV lithography.

Photolithographic masks have to fulfil highest demands with respect to transmission homogeneity, planarity, pureness and temperature stability. In order to fabricate photolithographic masks with a reasonable yield, defects or errors of masks have to be corrected at the end of the manufacturing process. Various types of errors of photolithographic masks and methods for their corrections are described in the US Provisionals U.S. 61/351,056 and U.S. 61/363,352 of a subsidiary of the applicant, which are hereby incorporated herein in their entirety by reference.

Typically, the basis of photolithographic masks is an ultra-pure substrate of fused quartz or other low thermal expansion material which has on one surface a thin chromium layer or a layer of another non light trans-parent material. The pattern elements of photolithographic masks are generated by a so-called pattern generator based on particle beams, predominantly electrons or a respective laser beam, which write the pattern elements in the absorbing material. In a subsequent etching process, the pattern elements are formed on the substrate of the photolithographic mask. FIG. 1 schematically illustrates a mask fabrication process. Details of the fabrication process are described in the fifth section of the specification.

The precise position of the pattern elements on the generated mask is measured using a registration metrology tool. When the photolithographic mask exceeds the maximum tolerable positioning error of the pattern elements, the mask has to be rewritten. During the rewriting process, it is at first tried to correct the positioning errors of the first writing process. However, this works only if the positioning errors are systematic. The writing time of a critical photolithographic mask may be very long and may reach a period of up to 20 h. Thus, the repeated writing of photolithographic masks is an extremely time-consuming and expensive process.

In an alternative process, positioning errors of photolithographic masks can be minimized by the application of a so-called registration correction (RegC) process. As described in the document U.S. 61/361,056, this process uses femtosecond or ultra-short light pulses of a laser system to locally change the density of the substrate of a photolithographic mask which results in a shift of the pattern placement on the substrate surface of the photolithographic mask.

In order to protect the structured absorbing layer, a pellicle is mounted on the surface of the photolithographic mask carrying the absorbing pattern elements. For critical masks, or more precisely of overlay-critical masks, the measurement of the position of the pattern elements has to be repeated in order to determine the influence of the pellicle on the positioning errors. This process is schematically represented in FIG. 1.

The generation of an integrated circuit on a wafer requires the successive application of several different photolithographic masks for the fabrication of the different layers or levels of the component. The plurality of photolithographic masks necessary for the generation of the integrated circuit is called a mask set. For an advanced integrated circuit, the mask set may comprise 20 to 50 different photolithographic masks. At the end of the mask fabrication process, the complete mask set is transferred from a mask shop to a wafer processing site or to a wafer fabrication site.

At the wafer processing site, a projection device successively illuminates a wafer by means of the individual photolithographic masks of the mask set in order to transfer the pattern elements of the various masks to the respective photo-resistive layer on the wafer. FIG. 2 schematically represents this process. By a lithographic process and a subsequent etching process the pattern elements of the photolithographic mask are copied to the wafer forming the respective layer of the integrated circuit. The overlap accuracy of the different photolithographic masks on the wafer is called overlay, and is determined by means of overlay targets also copied from the photolithographic mask to the photo resist layer on the wafer using an overlay metrology system.

If the overlay error of successive masks exceeds a predetermined threshold, the projection device is readjusted, the illumination of the latest mask is repeated and the overlay error is again measured. When the overlay error still surmounts the overlay budget, the root cause of the error has to be analysed and the overlay specification is tightened. The respective mask is sent back to the mask fabrication site or the mask shop for rewriting of its pattern elements. As already briefly mentioned, this repair or rewriting process is extremely time-consuming and significantly hampers the wafer processing at the wafer processing site.

At a wafer processing site, the overlay is presently determined at several dedicated targets such as Box in Box, Bar in Bar and AIM (advanced imaging metrology) overlay targets which are arranged at the four corners of the scribe line of the integrated circuit. The article "Meeting overlay requirements for future technology nodes with in-die overlay metrology", by B. Schulz et al., Proc. SPIE Vol. 6518, 2007, describes that judging the quality of a photolithographic mask by the standard registration measurement in the scribe line is not at all representative of the placement of the structures in the die. This situation can only be improved when the specification of pattern placement errors of photolithographic masks is based on a higher sampling plan including representative structures and especially locations within the die. The authors of this article report also of measurements on the influence of the pellicle to the overlay error. They conclude that this contribution is in the range of 1 nm (3σ value), however, it was too small to be determined with the available methodology and the precision levels of the overlay metrology system.

With the extension of the 193 nm ArF (argon fluorine) lithography to the 32 nm technology node highest demands are made to the positioning errors of the photolithographic masks and the overlay accuracy on the wafer. For the 32 nm node, the overlay budget reduces to about 6 nm (3σ value) depending on the device or integrated circuit to be produced. Moreover, the applicant detected that the contribution of the mounting of the pellicle to the positioning error may be significantly larger than estimated in the above mentioned article. This error may reach a dimension of some nanometres, which may take up more than 50% of the overall overlay budget. This error significantly reduces the yield of the overall wafer fabrication process and can therefore not be tolerated. Furthermore, the situation is complicated as the influence of the pellicle mounting process can only be poorly corrected in advance due to its insufficient systematics.

Below the 32 nm node, so called double patterning technologies are applied which require overlay accuracies of below 2.5 nm for some schemes. In double patterning lithography (DPL), the pitch size, which limits the patterning resolution, doubles with respect to single patterning. The author P. Zimmermann summarizes in the article "Double patterning lithography: double the trouble or double the fun?", SPIE Newsroom, Jul. 20, 2009, various double patterning approaches. Presently, three double patterning variants seem to be promising for the application in lithography systems:

(a) The litho-etch-litho-etch (LELE) process is schematically shown in FIG. 9. A hard mask (hard mask #1 in FIG. 9) is deposited on the layer which is to be patterned (hard mask #2 in FIG. 9). The wafer is exposed with a first photolithographic mask (first exposure, dark columns is FIG. 9). The hard mask #2 is etched (first etch). Then the wafer is exposed with the second mask (second exposure, dark columns in FIG. 9). Finally, the hard mask #2 is etched and thus forming the combined pattern of the first and the mask in this layer.

(b) FIG. 10 schematically presents the litho-freeze-litho-etch (LFLE) process. This process works by freezing the developed photo resist pattern of the first exposure, which is symbolized by three columns in FIG. 10. Then a second photo resist layer is added prior to the second exposure (not shown in FIG. 10). The photo resist pattern of both photolithographic masks is then etched in one step after development of the photo resist.

(c) The self-aligned double patterning (SADP) process is depicted in FIG. 11. It begins with the deposition of a photo resist layer on the layer to be etched. In the next step the photo resist layer is exposed and developed.

A spacer layer is then deposited over the pattern generated in the lithography step which covers all pattern elements. The covered layer is then selectively etched away leaving two sidewalls along any ridge. In the next step, the photo resist material is removed and the layer is etched wherein the remaining spacers form an etch mask. Finally, the residual spacers are removed.

In double patterning processes, in particular in LELE and LFLE processes, critical dimension uniformity (CDU) and overlay errors are complex. Furthermore, a double patterning lithography process entangles CDU and overlay error. In the article "Towards 3 nm overlay and critical dimension uniformity: an integrated error budget for double patterning lithography" W. A. Arnold discusses the various contributions to the error budget. He detects that the double patterning lithography process has profound implications on the CDU as well as on the overlay error. As already mentioned this requires overlay errors of about 2.5 nm and CDU variations of less than 1 nm.

It is therefore one object of the present invention to provide a method and an apparatus for measuring (i.e. "metrology") and correcting errors on wafers illuminated by a photolithographic mask which at least partly avoid the problems discussed above.

3. SUMMARY OF THE INVENTION

According to a first aspect of the invention, a method according to patent claim 1 is provided. In an embodiment, a method for correcting at least one error on wafers processed by at least one photolithographic mask comprises measuring the at least one error on a wafer at a wafer processing site, and modifying the at least one the photolithographic mask by introducing at least one arrangement of local persistent modifications in the at least one photolithographic mask.

The defined method measures errors on a wafer generated at the illumination or the exposure of the wafer with a photolithographic mask at the final wafer overlay at the wafer processing site or at the wafer fabrication site. Therefore, the inventive method takes all problems into account which have influenced the measured overlay errors on the wafer. Since the overlay budget will further shrink with future technology nodes, it will be mandatory to determine the overall error for the mask overlay. It will be more and more difficult to separate the various contributions of the overall overlay error and to separately correct them. For example, the inventive principle a priori considers the impact of the pellicle mounting process to the measured data. Furthermore, the problems of the projection device of the photolithographic illumination system are also automatically taken into account.

The inventive principle detects errors on the wafer generated by the illumination process of different photolithographic masks. A method known as registration correction (RegC) and described in the document U.S. 61/351,056 allows the calculation of shifts or displacements of pattern elements, so that the errors detected on the wafer can be corrected by modifying the pattern placement on the respective photolithographic mask(s). For this purpose, at the wafer processing site, femtosecond or ultra-short light pulses of a laser system are applied in order to modify the density of the mask substrate which induces the required pattern placement shifts. By this process, the individual masks representing different layers of the integrated circuit can be directly aligned to each other. Hence, the defined method reduces the alignment errors of different masks resulting in the minimization of the overlay error. Thus, the inventive method avoids to a large extent the involved rewriting of already existing photolithographic masks.

In a further aspect, a method for correcting errors on a wafer processed by a photolithographic mask at a wafer processing site comprises measuring of errors on the wafer, and modifying a pattern placement on the photolithographic mask by locally applying femtosecond light pulses of a laser system to the photolithographic mask at the wafer processing site.

The inventive method can compensate local CD errors and overlay errors of photolithographic masks, i.e. which are errors not correctable with the scaling and orthogonality (S/O) corrections of a scanner of the projection system. Thus, it is well suited to correct local errors of photolithographic masks or simply of masks resulting in low overlay errors at the fabrication of integrated circuits (ICs). Therefore, the inventive method supports the introduction of further technology nodes which use DPL processes having tight overlay error budgets.

In a further aspect, the at least one error on the wafer comprises at least one pattern placement error and/or at least one critical dimension error and/or at least one overlay error of a plurality of photolithographic masks.

The inventive method is not restricted to the correction of overlay errors originating from pattern placement errors on the photolithographic mask and/or from alignment problems of the projection device used in the photolithographic illumination system as well as mask heating, mechanical strains impacting pattern fidelity and additional contributors to overlay errors on wafer level. It can also be used to correct a variation of the optical transmission resulting in CD (critical dimension) errors across the wafer. Furthermore, the inventive method allows simultaneously correcting both types of errors.

In another aspect, the at least one error on the wafer comprises at least one pellicle mounting error and/or at least one imaging error of a photolithographic projection exposure system.

The error(s) generated by one or several photolithographic masks are measured at the wafer processing site, thus the detected error(s) comprise all the contributions of a real production environment. Besides errors of the respective mask(s), it also contains defect portions occurring due to a mounting of a pellicle on a mask and defects which are not correctable of the projection exposure system.

According to another aspect, the at least one overlay error comprises at least one error of at least one of the at least two photolithographic masks used in a multiple patterning lithography process.

The multiple patterning lithography process may be a double, a triple, a quadruple, etc. patterning lithography process. A multiple patterning lithography requires multiple photolithographic masks for the printing of a single layer on a wafer. Therefore, a multiple patterning lithography processes adds a new contribution to the overlay error. This is a placement error of two or several masks which are used to form the pattern for a single layer on the wafer.

In a further aspect, the at least one overlay error comprises at least one error of at least one of the at least two photolithographic masks used in a double patterning lithography process. In still another aspect, the double patterning lithography process comprises a litho-etch-litho-etch (LELE) process, a litho-freeze-litho-etch (LFLE) process, or a self-aligned double patterning (SADP) process.

As already mentioned above DPL processes are presently in the focus as lithography technologies which enable the introduction of further technology modes if the very tight error budgets, in particular with respect to CDU and overlay errors can be fulfilled. Various features or the defined method are able to significantly reduce these errors.

According to another aspect, measuring of the at least one error comprises measuring of at least one error in the active area of a chip (in-die).

As already mentioned above, the 32 nm technology node and future technology nodes will require the detection of the pattern placement not just in the scribe line at the four corners of the die, but at a regular grid on the die itself (in-die). The presented method supports the measurement of the positioning errors of the pattern elements in-die. In particular, an overlay metrology system is now available which enables the measurement of positioning errors in the sub-nanometer range, so that contributions to the overlay error can now be detected which have been out of reach up to now.

In still another aspect measuring of the at least one error comprises using a scanning electron microscope and/or a scatterometer.

The application of a comprehensive metrology system which may use photons as well as electrons for detecting errors on a wafer allow onwafer intra-field overlay metrology with high polynominal orders, i.e. with high resolution and accuracy. It may cover all overlay metrology use cases. Moreover, the laser source typically used for the introduction of the arrangement(s) of local persistent modifications in a mask can be performed by separate tools or can be integrated in a comprehensive metrology system. This means that both steps of the correction method defined above can be combined in a single tool. Thus, the defined correction method can completely be performed at the wafer processing site in order to accomplish the final goal to achieve a high quality pattern on the wafer within the wafer fab specification for dimensions, pattern placement and overlay between patterns placed on the wafer. It is also possible to measure the error(s) on a wafer at the wafer processing site and modifying or correcting the mask at the mask shop or elsewhere, or vice versa.

When the process is performed based on wafer data, both mask errors and photolithography processing errors are handled (i.e. error of projection, mask alignment, photo resist processing and additional components in the photolithography process and equipment modules).

According to another aspect, in-die measuring of the at least one error comprises measuring of a shift of at least one two-dimensional and/or at least one three-dimensional structure on a wafer and/or measuring of an ellipticity of at least one two-dimensional and/or at least one three-dimensional structure with an imaging-based or a model-model-based metrology method. In yet a further aspect, in-die measuring of the at least one error comprises measuring of a shift of at least one contact hole and/or measuring of an ellipticity of at least one contact hole with a scanning electron microscope.

The determination of a shift and of the ellipticity of a plurality of contact holes or more generally of a two-dimensional and/or of three-dimensional structure enables to detect overlay errors and/or CDU errors of one or both masks in a double patterning lithography process or more generally in a multiple patterning lithography process which uses a two-dimensional pattern.

In another aspect, in-die measuring of the at least one error on the wafer provides an in-die flag for least one arrangement of local persistent modifications in the at least one photolithographic mask.

Parallel to an increase in the accuracy of the error detection on the wafer, in-die measurements also provide information where to position the arrangement(s) of local persistent modifications in a photolithographic mask which correct or compensate the detected error(s).

In a further aspect, measuring of the at least one error comprises measuring at a developed photo resist layer on the wafer and/or on the wafer.

The measurement of overlay errors on a wafer can be performed at the developed photo resist on the wafer. Thus, when the detected errors are below the predetermined threshold, the processing of the wafer can be continued. If the detected errors exceed the tolerable level, the last illumination or exposure step can be repeated by removing the photo resist from the wafer and dispensing a new layer of photo resist. Prior to the second illumination, the error of the photolithographic mask is also corrected.

In another aspect, the at least one photolithographic mask comprises a pellicle.

In still another aspect, introducing the at least one arrangement of local persistent modifications comprises locally applying ultra-short light pulses of a laser system onto the at least one photolithographic mask.

According to a further aspect, modifying the photolithographic mask comprises modifying a pattern placement on and/or an optical transmission of the photolithographic mask by introducing at least one arrangement of local persistent modifications. In a further aspect, introducing the at least one arrangement of local persistent modifications does not introduce a variation of the optical transmission across the photolithographic mask. According to still another aspect, introducing the at least one arrangement of local persistent modifications corrects pattern placement errors and/or optical transmission errors of the photolithographic mask.

As already briefly mentioned above, femtosecond or ultra-short light pulses of a laser system can for example write an arrangement of local density variations, called pixels, in a substrate of a photolithographic mask which shift pattern elements on the surface of the photolithographic mask to a predetermined position. The induced density variation of the substrate corrects pattern placement errors on the surface of the photolithographic mask, and thus minimizing the overlay error of the mask. On the other hand, an arrangement of pixels can be written in the mask substrate which corrects a variation of the optical transmission across the photolithographic mask, so that CD errors can be corrected without inducing a shift of the pattern elements on the surface of the substrate of the photolithographic mask. Moreover, an arrangement of pixels can be defined and written which corrects both, pattern placement errors and optical transmission errors.

In another aspect, introducing the at least one arrangement of local persistent modifications locally changes a density of a substrate of the photolithographic mask. Another aspect further comprises the step of introducing the at least one arrangement of local persistent modifications in a centre of the height of the substrate.

The writing of pixels in the centre of the mask substrate avoids a bending of the substrate which might introduce image defects resulting in further errors on the wafer illuminated with the respective photolithographic mask.

In still a further aspect, the photolithographic mask comprises a transmissive photolithographic mask and/or a reflective photolithographic mask and/or a template for the nanoimprint lithography.

The generation of integrated circuits on wafers, which rely on a plurality of any kind of masks, has the problem to align pattern elements of different masks. Thus, the inventive method can be used to solve or at least significantly reduce overlay errors occurring in these wafer fabrication processes.

In another aspect, the error is at least one overlay error of a majority of photolithographic masks, the method further comprising the step of: correcting the at least one overlay error by introducing at least one arrangement of local persistent modifications in the at least one of the majority of photolithographic masks. In a further aspect, the majority of the photolithographic masks are used for a multiple patterning lithography process.

In a beneficial aspect, the error is at least one overlay error of at least one first photolithographic mask and at least one second photolithographic mask, the method further comprising the step of: correcting the at least one overlay error by introducing at least one arrangement of local persistent modifications in the at least one first photolithographic mask and/or in the at least second photolithographic mask so that the at least one overlay error is minimized.

According to a further aspect, multiple photolithographic masks are used in a multiple photolithography process. In another aspect, the at least one first photolithographic mask and the at least one second photolithographic mask are used for a double patterning lithography process.

The overlay error correction method defined in the two preceding paragraphs can be applied to multiple patterning lithography (MPL) processes which use multiple exposures. In particular, it can be applied to DPL processes which use a double exposure. In a double patterning lithography process often two masks have used to generate the pattern of a single layer of a wafer. One or both of these masks may contribute error(s) which manifest in an overlay error of the DPL process. Consequently, the error portions of both masks used in the DPL process are measured, and one or both of these masks are corrected in order to minimize the overlay error of the DPL process.

In a further aspect, correcting the at least one overlay error comprises introducing at least one first arrangement of local persistent modifications in the at least one first photolithographic mask and/or introducing at least one second arrangement of local persistent modifications in the at least one second photolithographic mask. According to another aspect, the at least one first arrangement of local persistent modifications is different from the at least one second arrangement of local persistent modifications.

It is possible to modify one or both of the masks used for the generation of a pattern in a DPL process. It is therefore possible to compensate a first portion of an overlay error on a first mask and a second portion of the overlay error on the second mask. Therefore, the arrangements of local persistent modifications in both masks may be similar or may be different.

In still another aspect, the at least one overlay error comprises at least one critical dimension uniformity error of the first photolithographic mask and/or at least one pattern placement error of the second photolithographic mask in a multiple patterning lithography process. In another aspect the multiple patterning lithography process uses a one-dimensional pattern.

According to a further aspect, the at least one overlay error comprises at least one critical dimension uniformity error of the first photolithographic mask and/or at least one pattern placement error of the second photolithographic mask in a double patterning lithography process. In another aspect, the double patterning lithography process uses a one-dimensional pattern. In yet a further aspect, correcting the at least one overlay error comprises the step of: introducing at least one arrangement of local persistent modifications in the at least one first photolithographis mask causing a pattern placement modification and/or introducing at least one arrangement of local persistent modifications in the at least one second photolithographic mask causing a variation of the optical transmission.

In a further beneficial aspect, measuring the at least one error on the wafer comprises: (a) generating a test mask having a test pattern, (b) printing and etching the test pattern of the test mask on the wafer, (c) printing and etching a photolithographic mask pattern on the test pattern of the wafer, and (d) determining the at least one error as a difference of at least one pattern element of the photolithographic mask and of the at least one respective test pattern element of the test mask.

In a further beneficial aspect, measuring the at least one error on the wafer comprises: (a) generating a test mask having a test pattern, measuring a test mask registration, a critical dimension, and/or a defectivity rate, and documenting the measured data as input for overall overlay and critical dimension shifts of the entire overlayed structure on the wafer; (b) printing and etching the test pattern of a product pattern of the test mask on the wafer, measuring the printed test mask registration, the critical dimension, and/or defectivity rate and documenting the measured data as input for the overall overlay and critical dimension shifts of an entire overlayed structure on the wafer; (c) printing and etching a photolithographic mask pattern on the test pattern or the product pattern of the wafer, wherein the test mask pattern is measured prior to the product mask pattern or vice versa, and (d) determining the at least one error as a difference of at least one pattern element of the photolithographic mask based on the documented measured data of registration shifts and/or critical dimension shifts of each printed layer to accomplish the entire overlayed structures on the wafer; and (e) of the at least one respective test pattern element of the test mask.

In still a further aspect, printing and etching of the test mask and printing and etching of the photolithographic mask comprises a single patterning lithography process or a multiple patterning lithography process.

In still a further aspect, printing and etching of the test mask and printing and etching of the photolithographic mask comprises a double patterning lithography process.

The test pattern of a test mask provides a reference pattern which is investigated in detail to have the predetermined shape and is arranged at the predetermined position. Therefore, the major portion of the overlay error of a test mask and a mask used in a wafer fabrication process in a single of a MPL process comes from the production mask. This means that the pattern of the photolithographic test mask has to fit to the pattern of the photolithographic production masks.

Still another aspect further comprises the step of determining an overlay error from a shift of a plurality of test pattern elements of the test mask relative to pattern elements of the photolithographic mask used in the single patterning lithography or multiple patterning lithography process.

Another aspect further comprises the step of determining an overlay error from a shift of a plurality of test pattern elements of the test mask relative to pattern elements of the photolithographic mask used in the double patterning lithography process. Still a further aspect comprises correcting the overlay error by using a scaling and orthogonality correction functionality or a scanner or of a stepper.

Beside the detection of local errors of a mask, the test pattern of the test mask can also be used to detect an overlay error of the photolithographic mask used with the test mask in a DPL process.

According to another aspect, the test pattern comprises in-die test features.

As already mentioned, this feature secures a high resolution at the error determination. Moreover, this feature allows a precise determination of the position at which the correcting pixels have to be introduced in the substrate of the photolithographic mask.

A further aspect comprises the test pattern with dense pattern elements, medium dense pattern elements, and isolated pattern elements.

Due to proximity effects in the lithography and due to etch loading effects the widths of dense lines and isolated lines having the identical width on the mask are different on a wafer. Having dense lines and isolated lines available on the test pattern allows controlling the effect of a mask on both, pattern elements as well as on assist features as optical proximity correction (OPC). The test mask pattern should take considerations into account related to pattern dimensions, placement, overlay and fidelity in order to generate high quality metrology data that will later be used as an input for the correction of the above considerations.

In yet another beneficial aspect, the test pattern of the test mask comprises pattern elements adapted for determining at least one overlay error of at least one overlay critical photolithographic mask. Still another aspect further comprises the step of measuring the overlay error of each overlay critical photolithographic mask.

By measuring the error(s) of the overlay critical masks the error budget of the overlay error of the IC fabrication process can be controlled. By compensating error(s) of overlay critical masks, tight error budgets of MPL or DPL processes can be met.

Still a further aspect comprises the step of introducing at least one arrangement of local persistent modifications in a photolithographic mask used in a self-aligned double patterning process. Another aspect further comprises the step of introducing the at least one arrangement of local persistent modifications in a sacrificial layer on the wafer used in a self-aligned double patterning process. In a further aspect, the at least one arrangement of local persistent modifications corrects a critical dimension uniformity error of a sacrificial layer arranged on the wafer.

CDU error(s) in the sacrificial layer of a SADP process causes overlaylike error(s) in the final etched pattern. This effect is known as "pitch walking". By in-die measurements of the spacer elements forming the etch mask, a variation of the lines and of the spaces of the SADP processes can be compensated by locally modifying the optical transmission of a mask so that the pattern generated with a modified or corrected mask counteracts the lines and the spaces variation.

According to a further aspect, an apparatus for correcting at least one error on wafers processed by a photolithographic mask comprises (a) at least one metrology system located in a wafer processing site and/or in a mask shop and adapted to measure the at least one error on a wafer, (b) at least one computing means adapted to calculate parameters for at least one error correction means based on the at least one measured error, and (c) the at least one error correction means is adapted to introduce at least one arrangement of local persistent modifications in the photolithographic mask by applying ultra-short light pulses.

In another aspect, an apparatus for correcting errors on a wafer processed by a photolithographic mask at a wafer processing site comprises (a) at least one overlay metrology system adapted for measuring of errors on the wafer, (b) at least one computing means adapted for calculating an arrangement of femtosecond light pulses for the photolithographic mask from measured error data, and (c) at least one laser system adapted for modifying a pattern placement on the photolithographic mask by applying the arrangement of femtosecond light pulses on the photolithographic mask.

In a further aspect, the apparatus is adapted to perform a method according to any of the aspects defined above.

According to still a further aspect, the at least one error correction means comprises at least one laser system. In another aspect, the at least one laser system is adapted to generate ultra-short laser pulses, in particular femtosecond laser pulses.

Finally, in another aspect, the at least one metrology system comprises an ultrahigh-precision stage, at least one laser source and at least one charge-coupled device camera operating in the ultraviolet wavelength range and/or a scanning electron microscope and/or a scatterometer and/or an image-based or a model-based metrology system.

4. DESCRIPTION OF THE DRAWINGS

In order to better understand the present invention and to appreciate its practical applications, the following Figures are provided and referenced hereafter. It should be noted that the Figures are given as examples only and in no way limit the scope of the invention.

FIG. 1 schematically represents a flow chart of a fabrication process of a set of photolithographic masks according to the prior art;

FIG. 2 schematically shows a flow chart of a use case of a set of photolithographic masks at a wafer processing site according to the prior art;

FIG. 3 schematically represents a block diagram of some of the major components of an apparatus used for measuring overlay errors on a wafer;

FIG. 4 schematically shows a block diagram of an apparatus used for correcting overlay errors in the substrate of a photolithographic mask;

FIG. 5 schematically represents a flow chart of a fabrication process of a set of photolithographic masks according to an embodiment of the inventive method;

FIG. 6 schematically shows a flow chart of a use case of a set of photolithographic masks at a wafer processing site according to an embodiment of the inventive method;

FIG. 7 schematically represents a displacement vector map measured at the scribe lines of dies;

FIG. 8 schematically illustrates a displacement vector map measured at nodes of a regular grid, i.e. at the scribe lines of dies and in-die;

FIG. 9 schematically presents process steps of a litho-etch-litho-etch (LELE) process;

FIG. 10 schematically shows process steps of a litho-freeze-litho-etch (LFLE) process;

FIG. 11 schematically depicts process steps of a self-aligned double patterning (SADP) process;

FIG. 12 schematically illustrates critical dimension uniformity and overlay errors of a cut-out of a one-dimensional pattern generated with a LELE or LFLE process;

FIG. 13 schematically shows a cut-out of a two-dimensional pattern generated with a LELE or LFLE process;

FIG. 14 repeats FIG. 13, wherein the horizontal pattern has an overlay error;

Figure 15:
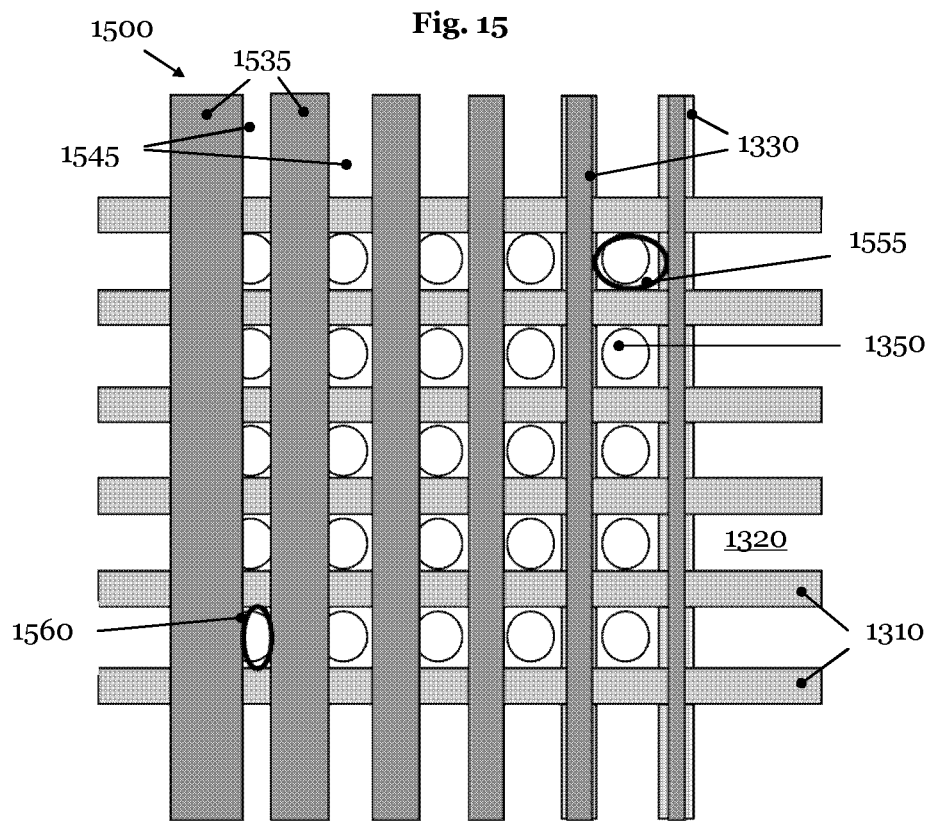
FIG. 15 illustrates FIG. 13, wherein the vertical pattern has a critical dimension uniformity error.
Figure 17:
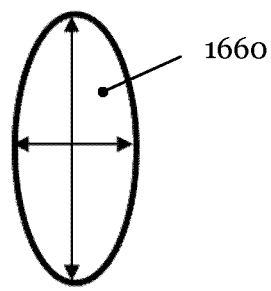
Figure 17:
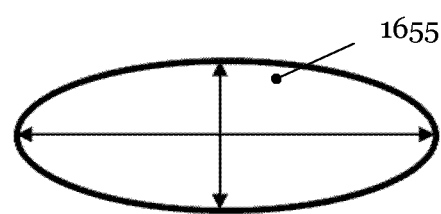
Figure 18:
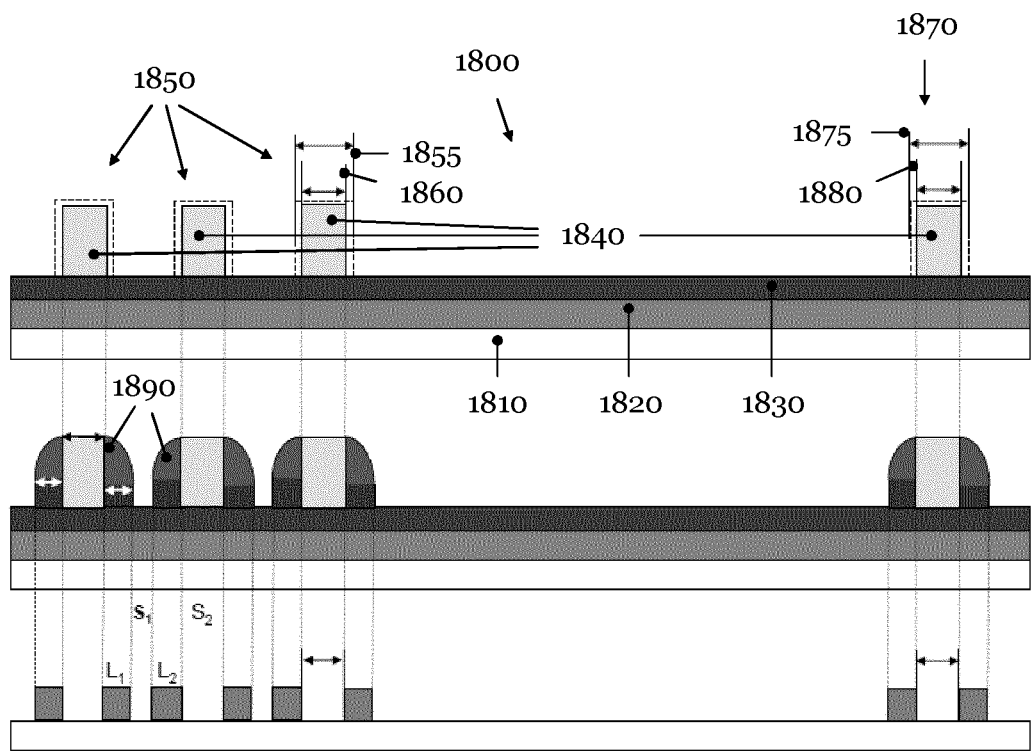
Figure 19:
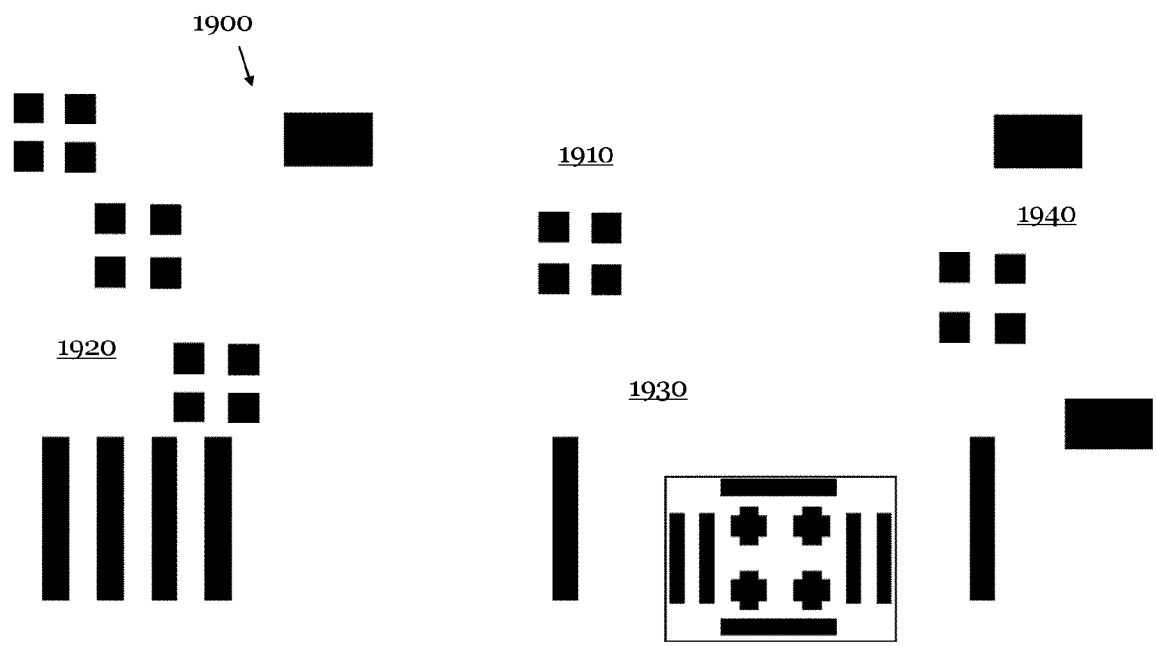
Figure 20A:
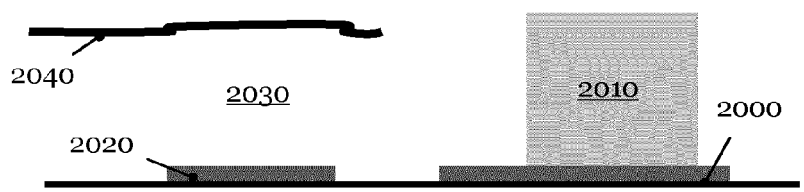
Figure 20B:
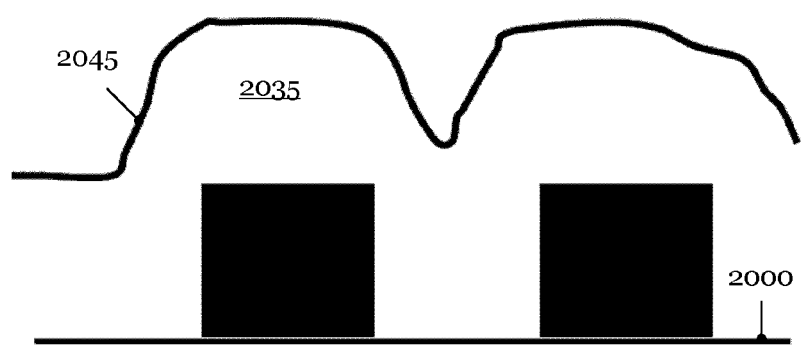
Figure 21:
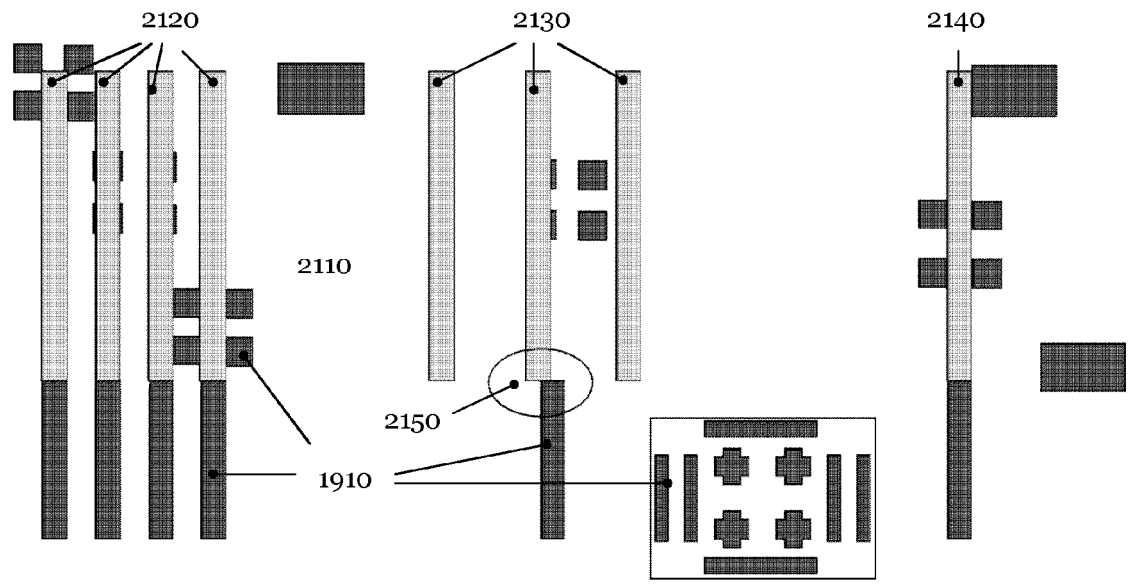
Figure 22:
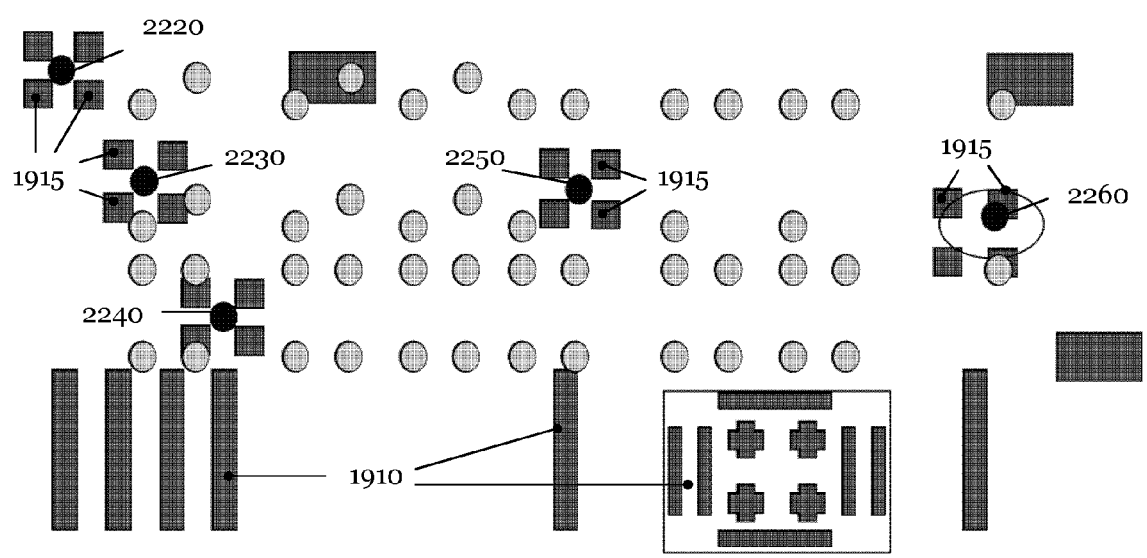
Figure 23:
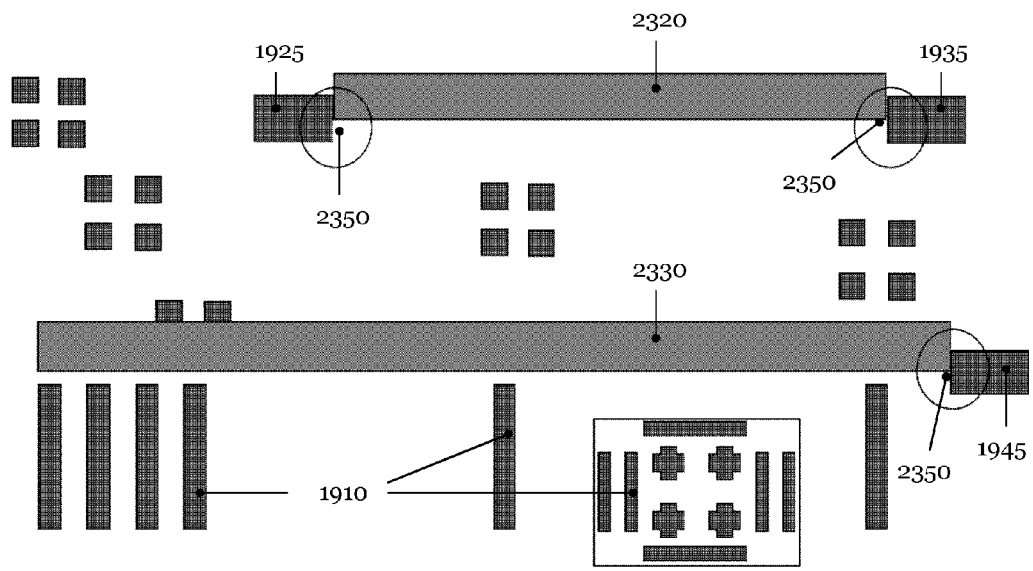
Figure 24:
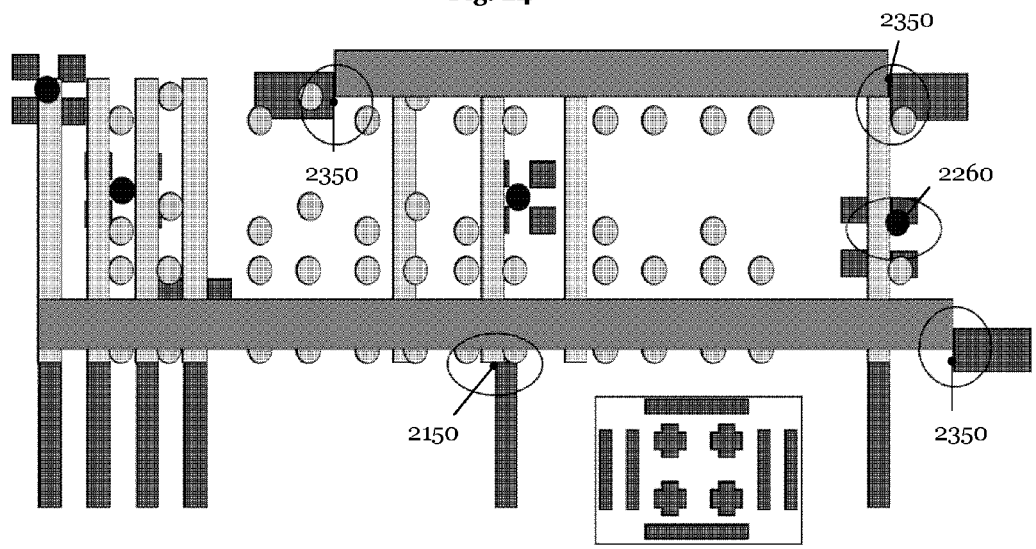
Figure 25:
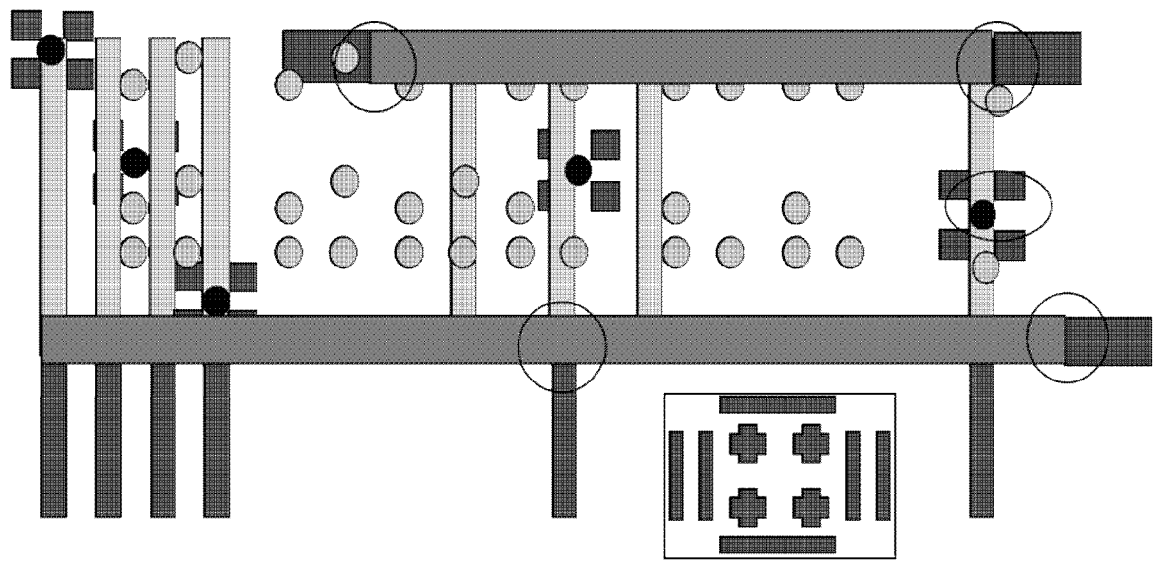
Figure 26:
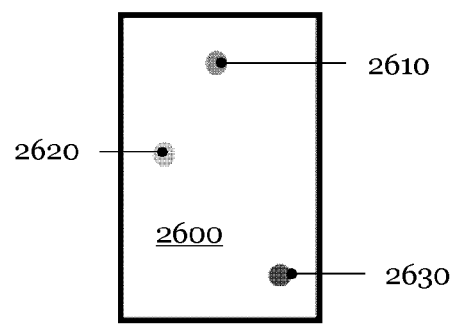
Figure 27:
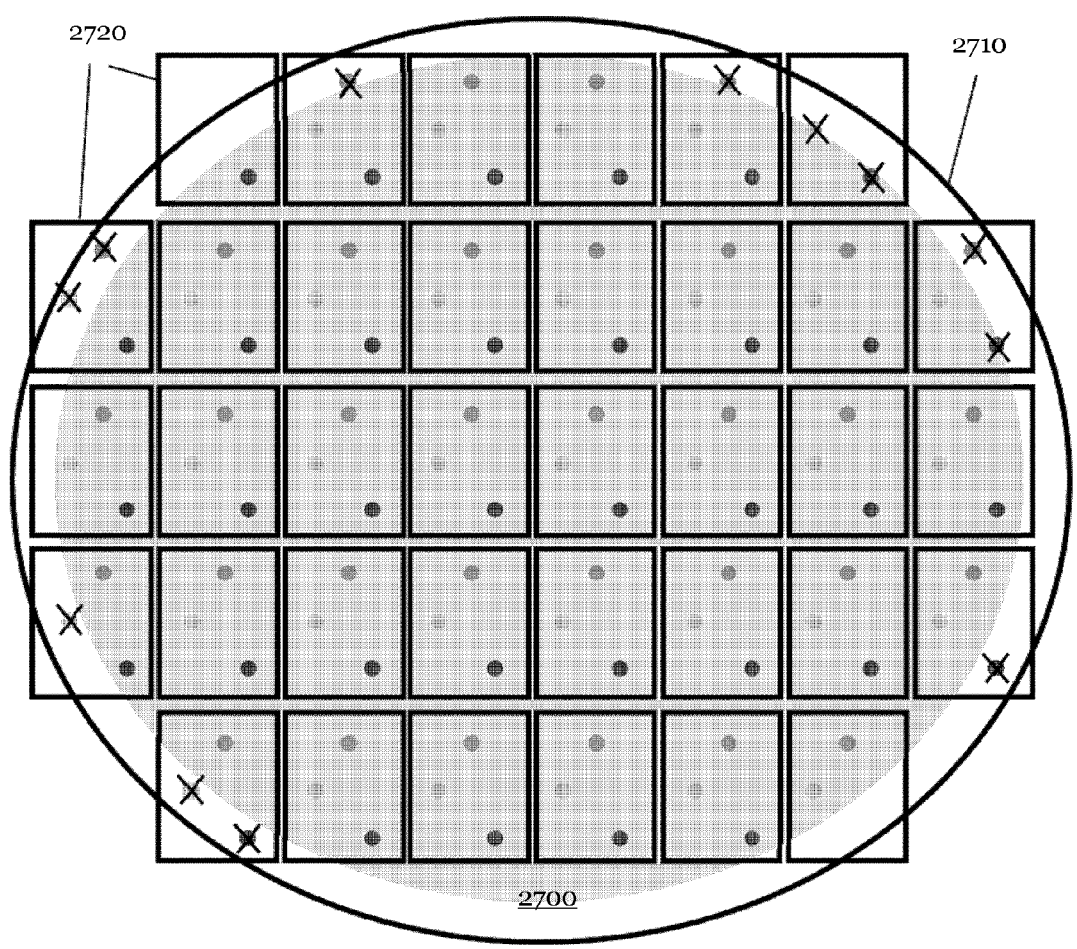
Figure 28:
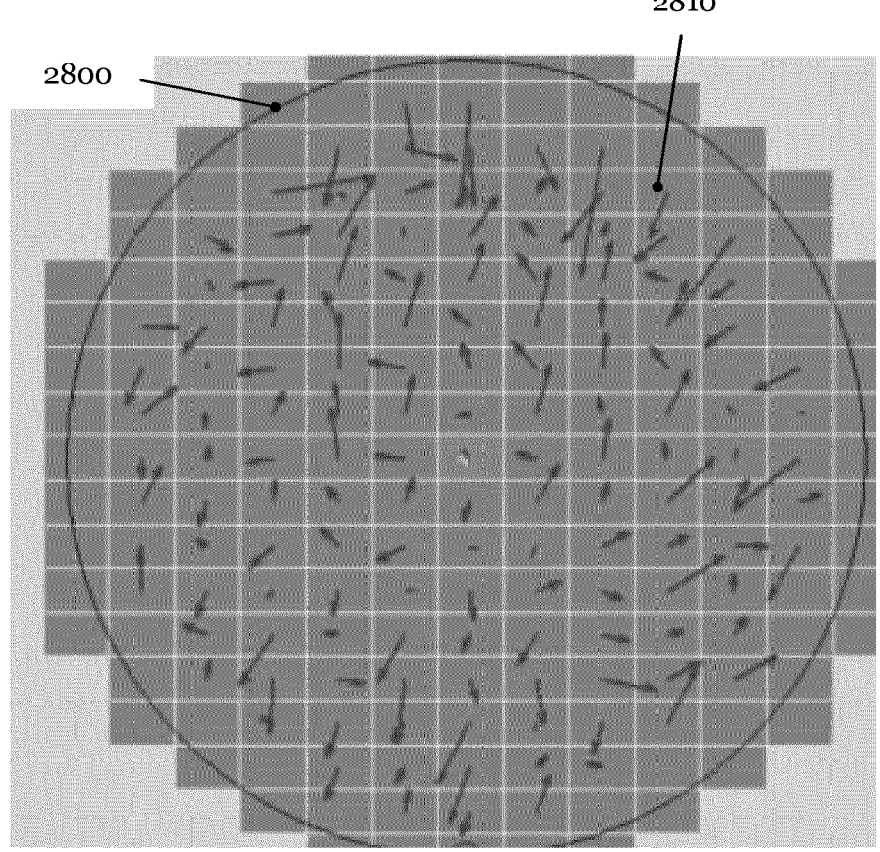
Figure 29:
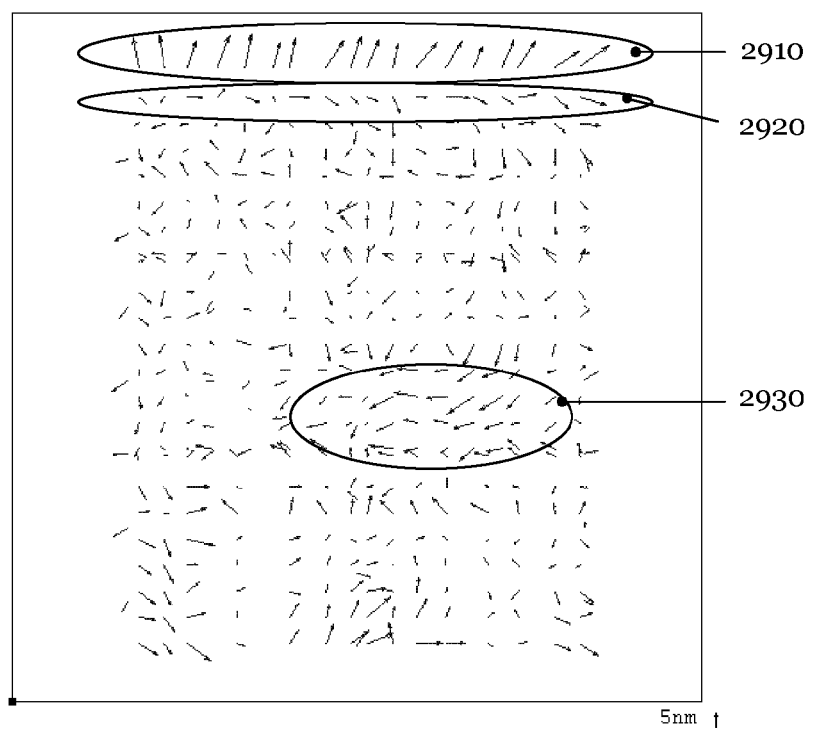
Figure 30:
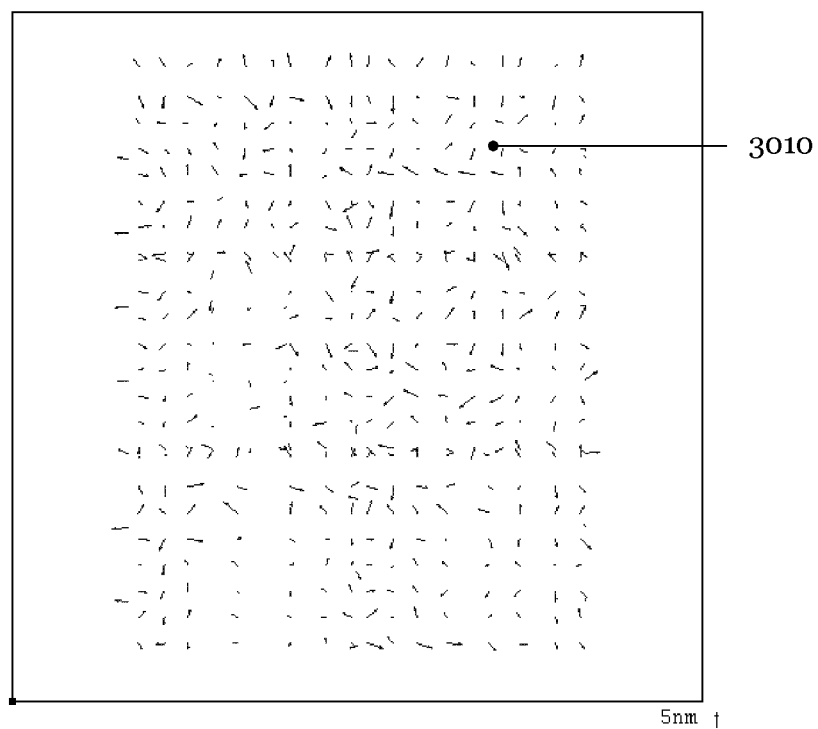

FIG. 17 schematically shows enlarged the contact holes of FIG. 15 which are elliptically deformed due to the critical uniformity error;

FIG. 18 schematically presents process steps and their variation of a self-aligned double patterning (SADP) process;

FIG. 19 schematically depicts a test pattern of a test mask;

FIG. 20a schematically shows a photo resist on a wafer after to the execution of second litho-etch steps in a LELE process having essentially a plane surface due to an introduction of a hard mask film with high optical contrast to the surface and photoresist layer to enable high resolution metrology in high accuracy, sensitivity and precision;

FIG. 20b schematically shows a photo resist on a wafer after to the execution of second litho-etch steps in a LELE process having a pronounced surface topography;

FIG. 21 schematically presents a LELE process of a test mask pattern and of a mask pattern having vertical line space features;

FIG. 22 schematically depicts a LELE process of a test mask pattern and of contact holes of a mask used in the DPL process;

FIG. 23 schematically shows a LELE process of a test mask pattern and of a mask pattern having horizontal line space features;

FIG. 24 schematically illustrates a superposition of the test pattern of the test mask of FIG. 19 and of the mask patterns of FIGS. 21 to 23;

FIG. 25 schematically depicts the superposition of the test pattern of the test mask of FIG. 19 and of the mask patterns of FIGS. 21 to 23, wherein the errors of the mask patterns of FIGS. 21 to 23 are corrected;

FIG. 26 schematically presents in-field targets for the determination of an averaged in-field overlay error;

FIG. 27 schematically shows a wafer covered with fields, wherein each field has the overlay targets of FIG. 26;

FIG. 28 schematically reproduces an overlay error map across a wafer;

FIG. 29 schematically illustrates an in-field error map resulting from an averaging of the in-field error distributions across the wafer; and FIG. 30 schematically depicts the averaged in-field error map of FIG. 29 after the systematic errors are corrected by introducing respective arrangements of local persistent modifications in the substrate of the photolithographic mask used for the printing of the wafer of FIG. 28.

5. DETAILED DESCRIPTION OF PREFERRED EMBODIMENTS

In the following, the present invention will be more fully described hereinafter with reference to the accompanying Figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

This first section describes an embodiment of the inventive method. To illustrate the inventive principle, differences are highlighted in the fabrication of a set of photolithographic masks with respect to the fabrication according the prior art. Further, these differences are also exemplified for a use case of a mask set. The inventive method is explained for the utilization of transmissive photolithographic masks. However, the person skilled in the art will appreciate that this is just an example and that the above defined method can also be applied to reflective photolithographic masks. Moreover, the inventive method is also well suited to correct overlay errors of templates for the nanoimprint lithography at a wafer processing site or at a wafer fabrication site.

In the following, the term integrated circuit (IC) is used for all devices fabricated on semiconducting wafers as for example memory or logic components, MEMS (microelectromechanical systems) including sensors, detectors and displays and PICs (photonic integrated circuits) including lasers and photodiodes.

The inventive method corrects errors detected on a wafer by applying femtosecond light pulses of a laser system to a photolithographic mask with which a wafer was illuminated. For the correction feature of the present invention, the specification refers to the US provisional with the No. 61/363,352. This document describes in detail how pattern placement errors can be corrected by the writing of a respective arrangement of pixels in the substrate of photolithographic masks. Some of the problems of photolithographic masks and of templates for the nanoimprint lithography are also briefly discussed in the above mentioned document.

Figure 1:
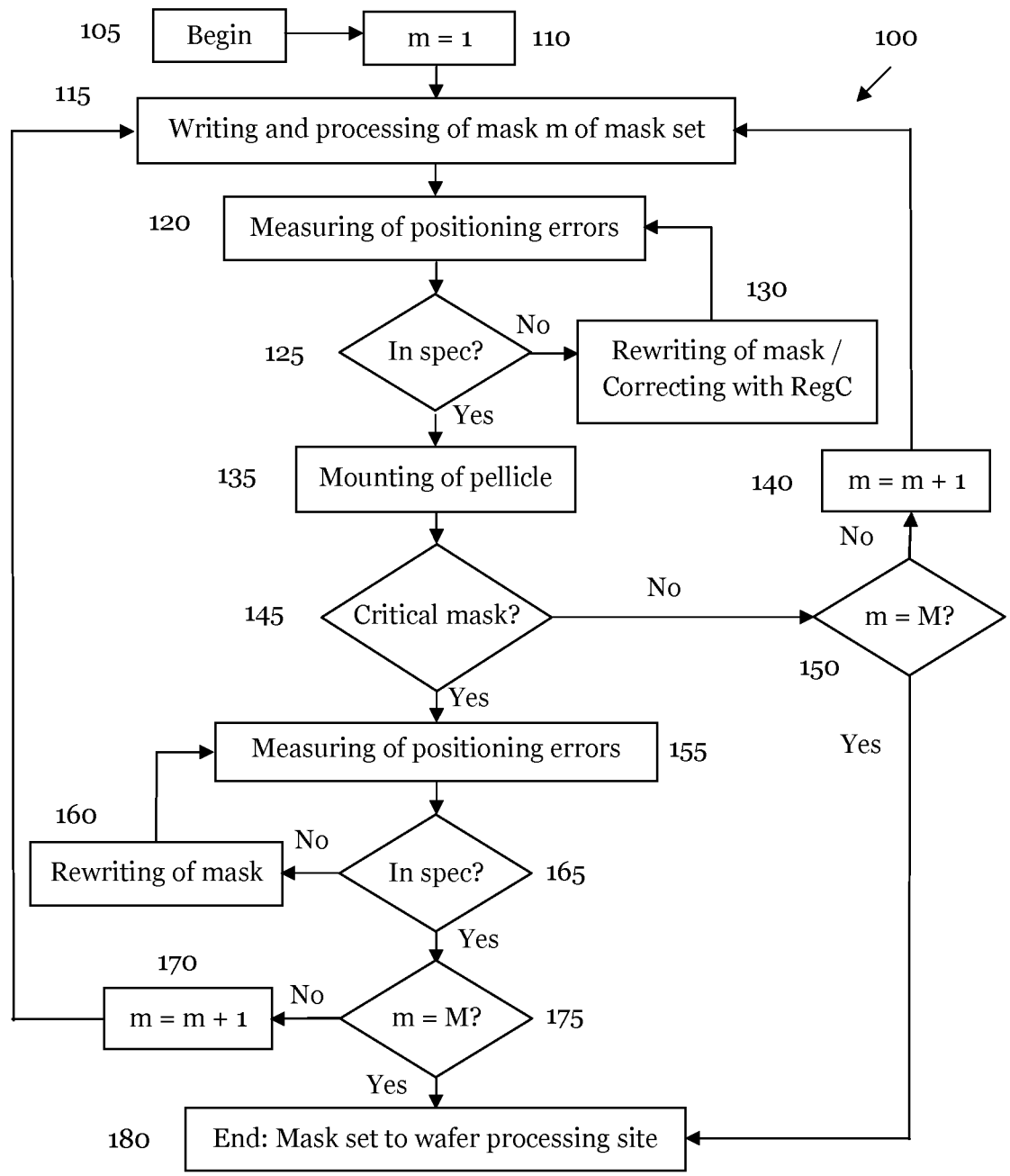

FIG. 1 outlines the fabrication process 100 for a mask set according to the prior art. The process begins at 105 with the writing of the pattern 115 of the first mask 110. Then, also at step 115, the excessive parts of the absorber layer are removed from the mask substrate, for example by etching. In the next step 120, the photolithographic mask is measured in order to determine the positioning errors of the mask pattern. At decision block 125, it is decided whether the positioning errors fulfil a predetermined specification. If this is correct, the pellicle is mounted on the mask in step 135. It is then decided at decision block 145 whether the mask is an overlay critical mask. The fabrication process is complete when mask m is not an overlay critical mask. If mask m is overlay critical (decision block 145), the mask is again measured at step 155 to check the effect of the pellicle mounting on the positioning errors. When it is determined at decision block 165 that mask m does not fulfil the specification, at step 160, the pellicle is removed and the pattern is rewritten in a new mask.

When it is determined at decision block 125 that the positioning errors of mask m do not fulfil the predetermined specification, at step 130, the pattern placement errors are corrected by using a so called RegC (Registration Correction) process, which is described in detail in the U.S. 61/351,056 and U.S. 61/363,352. If the positioning errors cannot be reduced by a RegC process so that mask m meets the specification, the pattern is written on a new mask and the process proceeds to step 120 where the mask is measured.

The process of FIG. 1 is repeated until all M masks of the mask set are fabricated (decision blocks 150 and 175). The complete mask set is then supplied to the wafer processing site at block 180.

Figure 2:
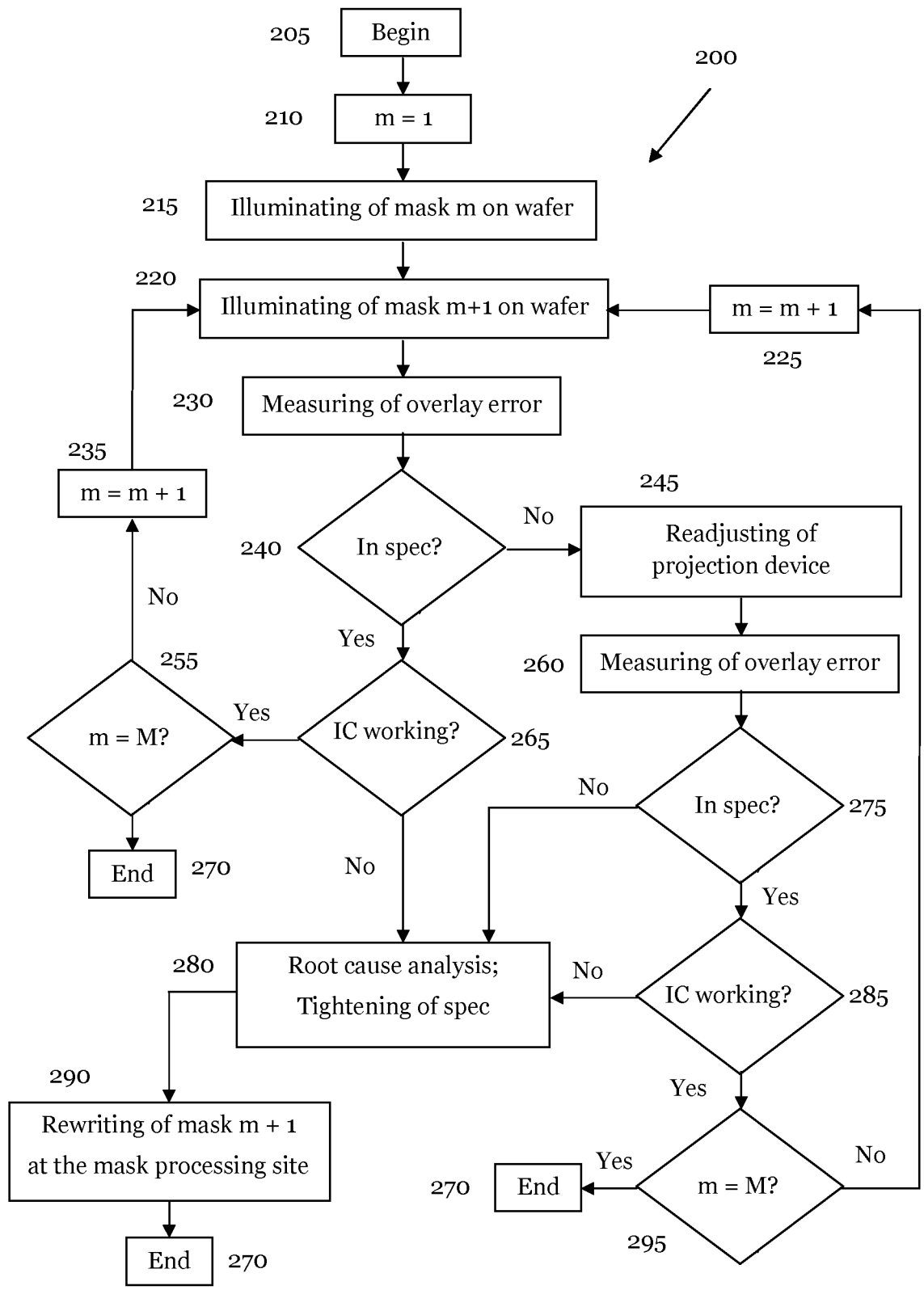

FIG. 2 briefly illustrates some steps of a mask illumination process for the fabrication of ICs at a wafer processing site. The process 200 begins at 205 with the illumination or the exposure of a wafer (step 215) with the first mask (step 210) of the mask set. The photo resist on the wafer is developed and the wafer is processed, for example by performing of an etching process. Then a second (generally $m^{th}$) layer of photo resist is arranged on the wafer (not illustrated in FIG. 2). At step 220, the wafer is illuminated with the second, or generally with the $(m+1)^{th}$ mask. The overlay errors between the first and the second mask, or in general between the $m^{th}$ and the $(m+1)^{th}$ mask on the wafer are measured at step 230. If it is decided at decision block 240 that the overlay error is below the predetermined overlay budget, it is at decision block 265 checked whether the IC to be fabricated will operate according to its specification. If this is correct, the process proceeds via decision block 295 and step 225 to block 220 where the wafer is illuminated with the next (third or $(m+2)^{th}$) mask. When it is determined at decision block that m reaches M which is the number of masks in the respective mask set, the process ends at block 270.

If it is decided at decision block 265 that the IC will not operate according to its specification, the root cause of the problem is analyzed at block 280 and the positioning specification for mask m+1 is tightened. In step 290, a new mask m+1 is then written at the mask processing site. The process ends at block 270. Then the new mask m+1 is supplied from the mask fabrication site to the wafer processing site, the process begins again at block 205 of FIG. 2.

When it is decided at decision block 240 that the overlay error does not meet the specification, the projection device of the illumination system is readjusted at block 245. Then, at step 260, the overlay error measurement is repeated. If it is determined at decision block 275 that the overlay error does still not fulfil the predetermined error budget, the process proceeds to step 280 and the cause of the problem is analyzed. In case the overlay error meets the specification, it is at decision block 285 determined whether the IC to be fabricated will operate according to its specification. If this is true, the process proceeds via decision block 295 across step 225 to block 220 where the wafer is illuminated with the next (third or $(m+2)^{th}$) mask of the mask set. Alternatively, when the illuminated mask is the last mask of the mask set (m=M), the process ends at block 270.

Figure 3:
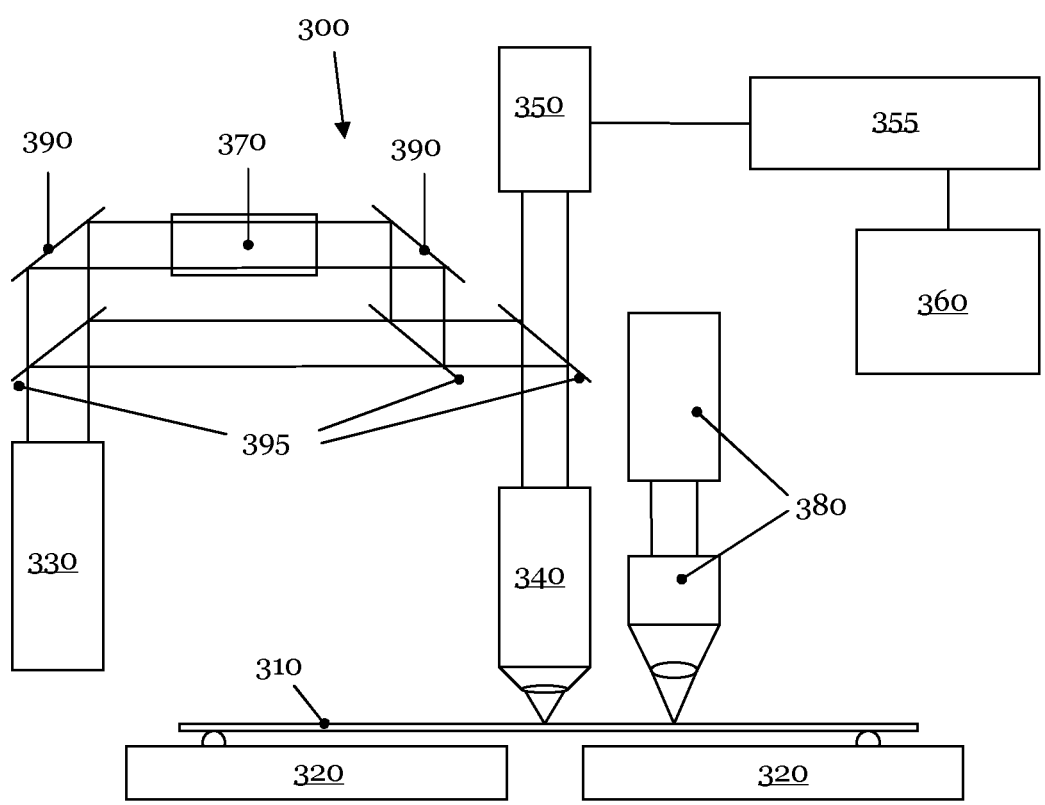

FIG. 3 shows a functional sketch of a registration metrology tool 300 with which pattern placement and overlay errors can be measured. A photolithographic mask 310 is supported by the high precision stage 320. The stage 320 is actively controlled in all six degrees of freedom and is the only moving part in the metrology system. As a light source an excimer laser 330 is used emitting light in the DUV (deep ultraviolet) wavelength range, at approximately 193 nm. This means that the inspection and the illumination of the photolithographic mask 310 occur at the same wavelength, as most masks are presently illuminated with a 193 nm light source. Hence, the registration and/or overlay metrology system 300 takes the effect of material properties properly into account.

The imaging objective 340 has a numerical aperture (NA) of 0.6, but can be extended to a higher NA in order to gain even more resolving power. The short wavelength of the laser system 330 significantly improves the resolution, and at the same time permits a moderate NA, which is beneficial for the CD (critical dimension) metrology and enables a pellicle compatible free working distance of about 7.5 mm. The imaging objective 340 is firmly fixed to the optical tower and is unmovable. Focusing of the laser beam onto the photolithographic mask 310 is done by a stage movement in z direction.

A CCD (charge-coupled device) camera 350 is used as a detector device which measures the light reflected from the photolithographic mask 310. The CCD camera 350 sends its signal to the signal processing unit 355 which calculates an image of the signal detected by the CCD camera 350.

A computer system 360 can display the image calculated by the signal processing unit 355 and may store the measured data. Further, the computer system 360 may contain algorithms, realized in hardware, software or both, which allow to extract control signals from the experimental data. The control signals may control the writing of an arrangement of pixels in the substrate of the photolithographic mask 310 by a second laser system in order to correct the pattern placement errors of photolithographic mask 310 (cf. FIG. 4 below). Further, the computer system 360 may control the laser source 3 and/or the high-precision stage 320 and/or the objective 340 and/or the CCD camera 350 and/or the AF system 370.

The surface of the photolithographic mask 310 may be slightly tilted, and in addition the bending of the mask 310 under its own weight leads to a variation of the best focal position. Therefore, the registration metrology tool 300 has an autofocus (AF) system 370 based on a tilted grating (not shown in FIG. 3) which supports the measurement process. The tilted mirrors 390 and the partially transmitting mirrors 395 direct the laser beam into the imaging objective 340.

Furthermore, the registration metrology tool 300 comprises an auxiliary optical system 380 for a coarse alignment of the pattern placement elements on the photolithographic mask 310.

Figure 4:
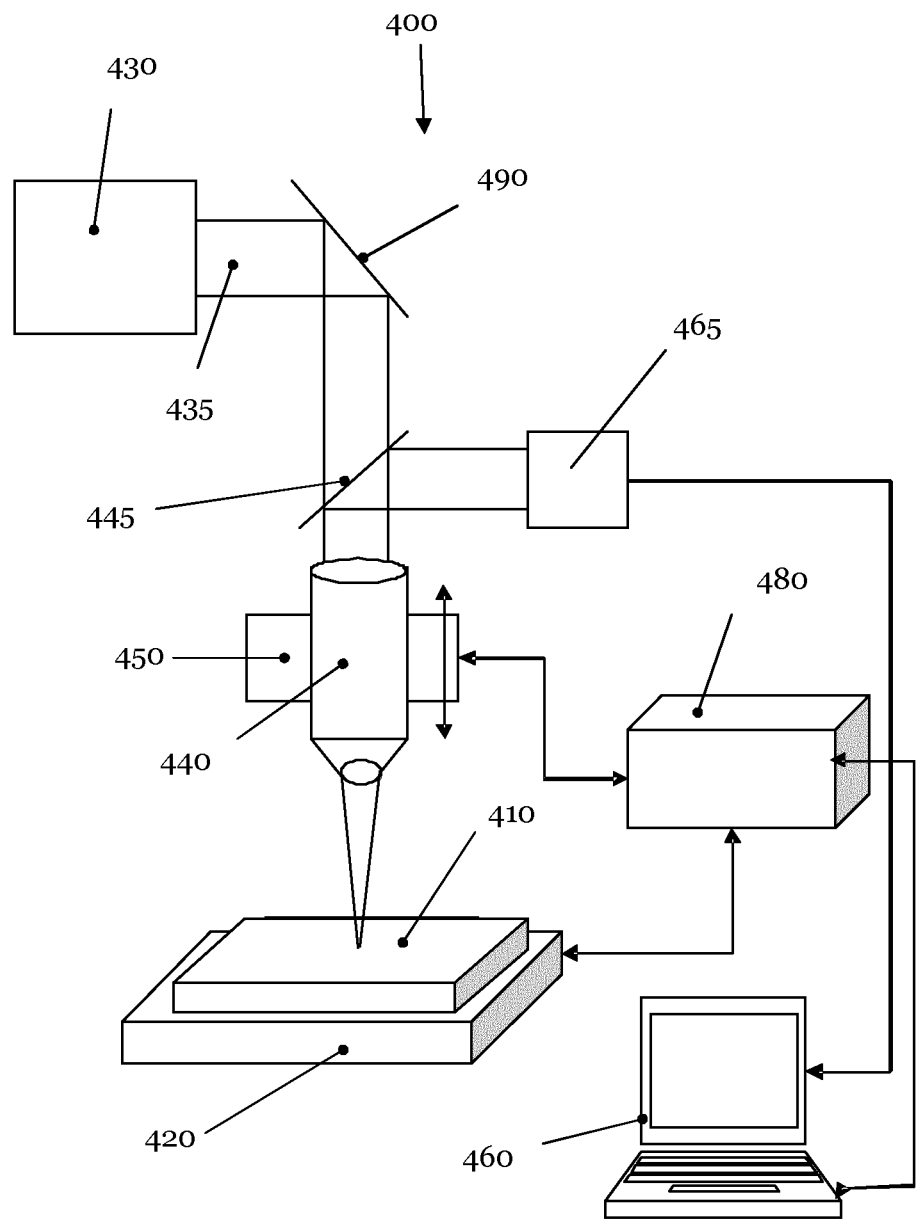

FIG. 4 depicts a schematic block diagram of an apparatus 400 which can be used to correct errors on wafers by modifying the substrate of a photolithographic mask. Further, the apparatus 400 is also able to correct errors of templates used in the nanoimprint lithography. The apparatus 400 comprises a chuck 420 which may be movable in three dimensions. The photolithographic mask 420 or a template for the nanoimprint technique may be fixed to the chuck 420 by using various techniques as for example clamping.

The apparatus 400 includes a pulse laser source 430 which produces a beam or a light beam 435 of pulses or light pulses. The laser source 430 generates light pulses of variable duration. The adjustable range of several import parameters of the laser source 430 is summarized in the following table. Table 1 represents an overview of laser beam parameters of a frequency-doubled Nd-YAG laser system which can be used in an embodiment of the inventive method.

TABLE 1

Numerical values of selected laser beam parameters for a Nd-YAG laser system
Overview

| Parameter | Numerical value | Unit |
|---|---|---|
| Pulse energy | 0.05-5 | µJ |
| Pulse length | 0.05-100 | ps |
| Repetition rate | 1-10 000 | kHz |
| Pulse density | 1 000-10 000 000 | mm−2 |
| NA (numerical aperture) | 0.1-0.9 | |
| Wavelength | 532 | nm |

In an alternative embodiment of the laser system the light pulses may be generated by a Ti:Sapphire laser operating at a wavelength of 800 nm. However, the correction of pattern placement errors is not limited to these laser types, principally all laser types may be used having a photon energy which is smaller than the band gap to the substrate of the photolithographic mask 410 and which are able to generate pulses with durations in the femtosecond range.

The steering mirror 490 directs the pulsed laser beam 435 into the focusing objective 440. The objective 440 focuses the pulsed laser beam 435 onto the photolithographic mask 410. The NA (numerical aperture) of the applied objectives depends on the predetermined spot size of the focal point and the position of the focal point within the photolithographic mask 410 or of the template. As indicated in table 1, the NA of the objective 440 may be up to 0.9 which results in a focal point spot diameter of essentially 1 µm and a maximum intensity of essentially $10^{20}$ W/cm$^2$.

The apparatus 400 also includes a controller 480 and a computer system 460 which manage the translations of the two-axis positioning stage of the sample holder 420 in the plane perpendicular to the laser beam (x and y directions). The controller 480 and the computer system 460 also control the translation of the objective 440 perpendicular to the plane of the chuck 420 (z direction) via the one-axis positioning stage 450 to which the objective 440 is fixed. It should be noted that in other embodiments of the apparatus 400 the chuck 420 may be equipped with a three-axis positioning system in order to move the photolithographic mask 410 to the target location and the objective 440 may be fixed, or the chuck 420 may be fixed and the objective 440 may be moveable in three dimensions. Although not economical, it is also conceivable to equip both the objective 440 and the chuck 420 with three-axis positioning systems. It should be noted that manual positioning stages can also be used for the movement of the mask 410 to the target location of the pulsed laser beam 435 in x, y and z directions and/or the objective 440 may have manual positioning stages for a movement in three dimensions.

The computer system 460 may be a microprocessor, a general purpose processor, a special purpose processor, a CPU (central processing unit), a GPU (graphic processing unit), or the like. It may be arranged in the controller 480, or may be a separate unit such as a PC (personal computer), a workstation, a mainframe, etc. The computer 460 may further comprise I/O (input/output) units like a keyboard, a touchpad, a mouse, a video/graphic display, a printer, etc. In addition, the computer system 460 may also comprise a volatile and/or a non-volatile memory. The computer system 460 may be realized in hardware, software, firmware, or any combination thereof. Moreover, the computer 460 may control the laser source 430 (not indicated in FIG. 4). The computer systems 360 of FIG. 3 and 460 of FIG. 4 may be connected to exchange data. Moreover, the computer systems 360 and 460 may be combined in a single computer system.

Further, the apparatus 400 may also provide a viewing system including a CCD (charge-coupled device) camera 465 which receives light from an illumination source arranged in the chuck 420 via the dichroic mirror 445. The viewing system facilitates navigation of the photolithographic mask 410 to the target position. Further, the viewing system may also be used to observe the formation of a modified area on the substrate material of the mask 410 by the pulsed laser beam 435 of the light source 430.

Figure 5:
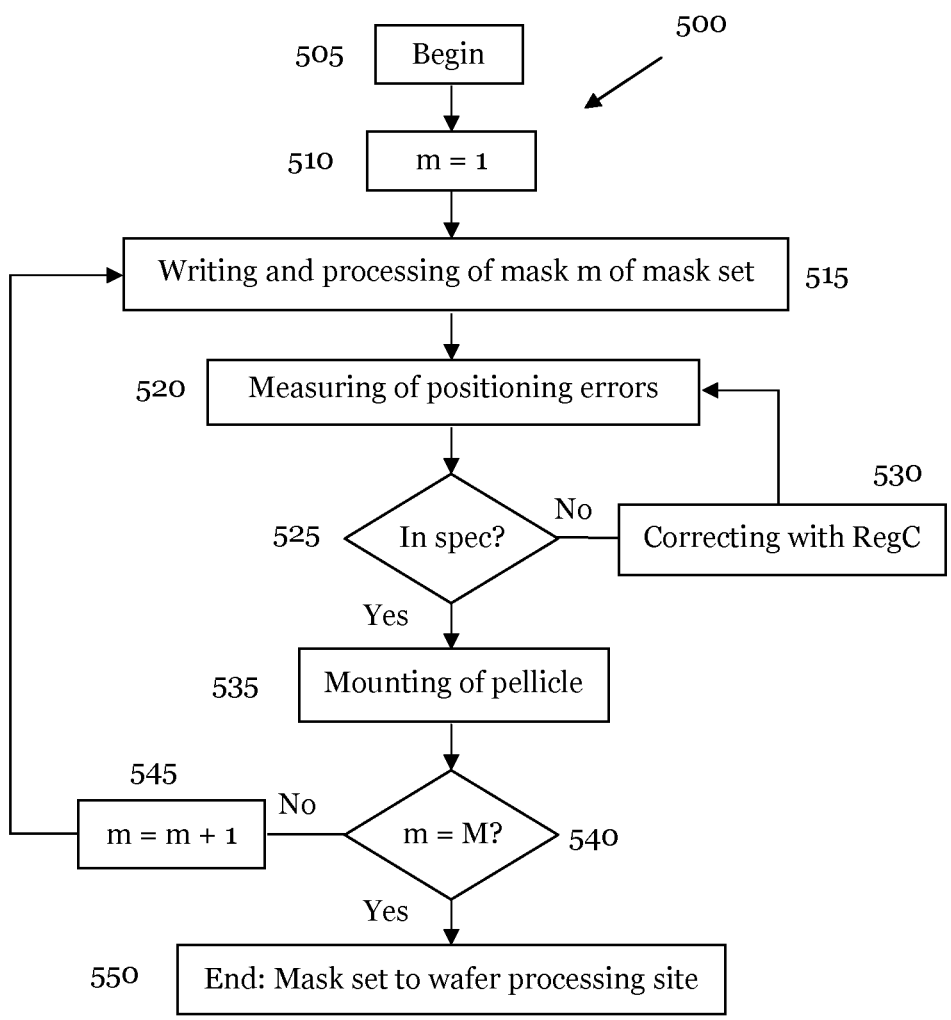

FIG. 5 schematically depicts an example of a fabrication process of photolithographic masks of a mask set according to the inventive method. As already briefly explained in the second section of this specification, a pattern of absorbing elements is written on an absorbing layer on the substrate of a photolithographic mask with a pattern generator. In a subsequent etching process, the absorbing pattern elements are formed from the absorbing material (box 515). A material often used for the absorbing layer on photolithographic masks is chromium. Tungsten can be used as another absorber material on the surface of mask substrates. The usage of the inventive method is not restricted to these materials; rather any absorber material can be used.

The positions of the generated absorbing pattern elements are measured with the registration metrology system of FIG. 3 in order to determine whether the pattern writing process was successful, i.e. the pattern elements have their predetermined size and form and are at the desired positions (box 520). If the determined positioning errors exceed a predetermined level (decision box 525), the positions of the pattern elements are modified by writing of an arrangement of pixels into the substrate of the photolithographic mask using the laser source 430 of the apparatus 400 of FIG. 4 (box 530 of FIG. 5). The arrangement of pixels locally changes the density of the mask substrate and thus shifts the pattern elements on the mask surface to the predetermined positions. Then, it is measured whether the repair of the mask was successful (box 520). If the measured positioning error is now below the predetermined threshold (decision box 525), the pellicle is mounted on the surface of the photolithographic mask carrying the absorbing pattern elements in order to protect them from being damaged. When all masks of the mask set are processed according to this scheme, the fabricated mask set is ready for the delivery to the wafer processing site.

As can be seen from FIG. 5, an embodiment of the mask fabrication process according to the inventive method largely avoids rewriting of photolithographic masks. If the positioning errors of a mask exceed the tolerable level, the respective mask is corrected by using the RegC process.

The mask fabrication process of FIG. 5 abandons of the measurement of positioning errors for overlay-critical photolithographic masks after mounting of the pellicle. This is the decisive distinction between the mask fabrication processes according to FIGS. 1 and 5.

Figure 6:
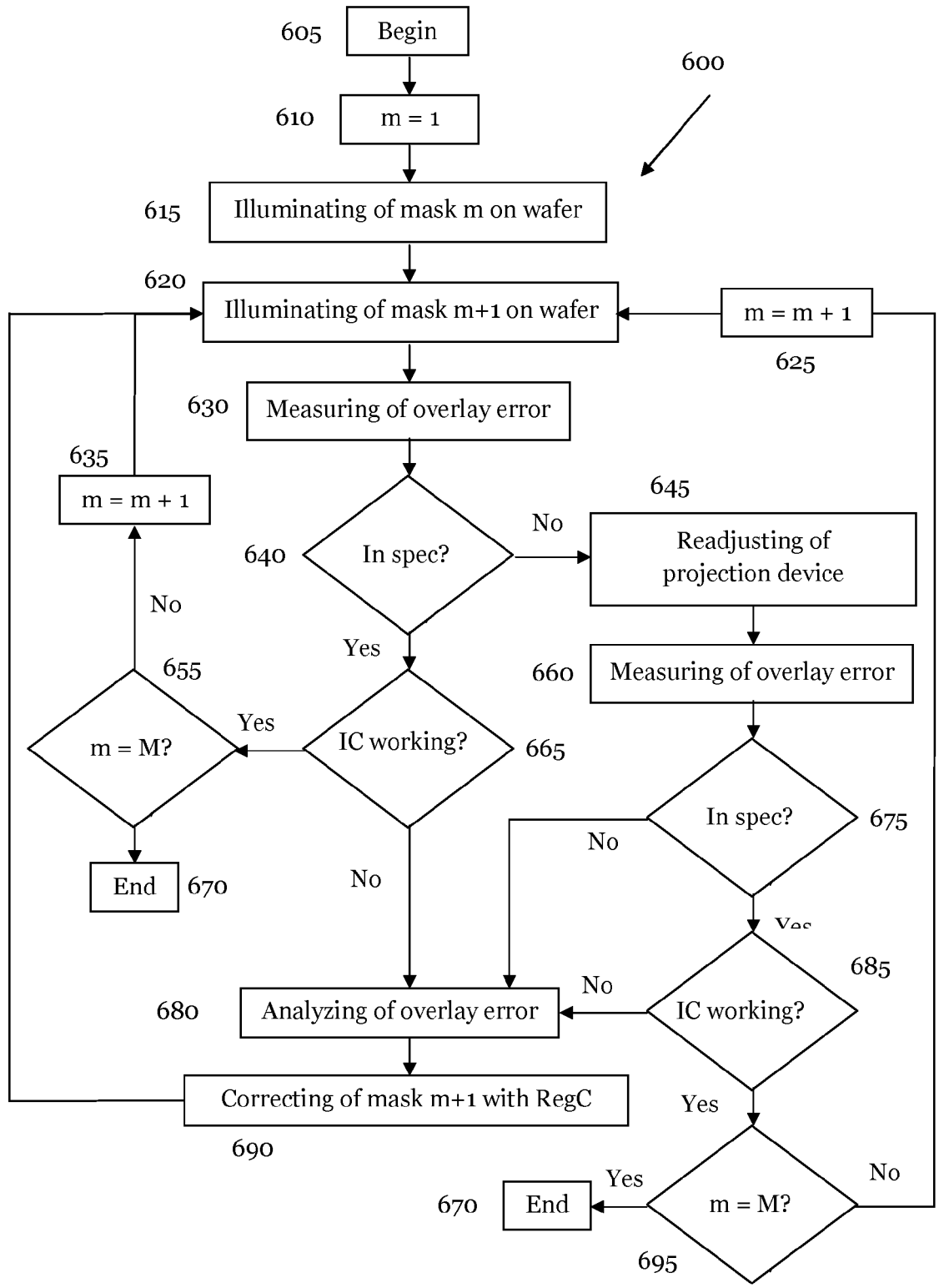

FIG. 6 schematically illustrates a use case of a set of photolithographic masks at the wafer processing site according to an embodiment of the inventive method. The process begins by illuminating of a wafer with a first mask using the projection device of the photolithographic illumination system (box 615). The first mask may be the first mask of a mask set, or in the general case, it may be any mask, but the last one of the mask set. The photo resist is developed, and the wafer is processed to generate a first layer, or generally an $m^{th}$ layer, respectively, of an integrated circuit. Then a new photo resist layer is dispensed on the wafer (not shown in FIG. 6).

In the next step (box 620), similar to the first photolithographic mask, a second photolithographic mask is aligned with respect to alignment marks on the wafer. Then the second mask, or generally the $(m+1)^{th}$ mask, is illuminated similar to the first mask in order to transfer the structure elements for the second layer, or general $(m+1)^{th}$, layer of the integrated circuit from the photolithographic mask to the wafer. The photo resist is then developed.

The photolithographic masks have overlay targets which are used to determine the overlay of the second mask with respect to the first photolithographic mask. The standard overlay targets are BiB (box-in-box) targets, which allow the detection of shifts or of displacements of the second mask relative to the first mask. Since the BiB targets have a rather coarse structure, they are now more and more replaced by AIM (advanced imaging metrology) and micro AIM overlay targets.

Figure 7:
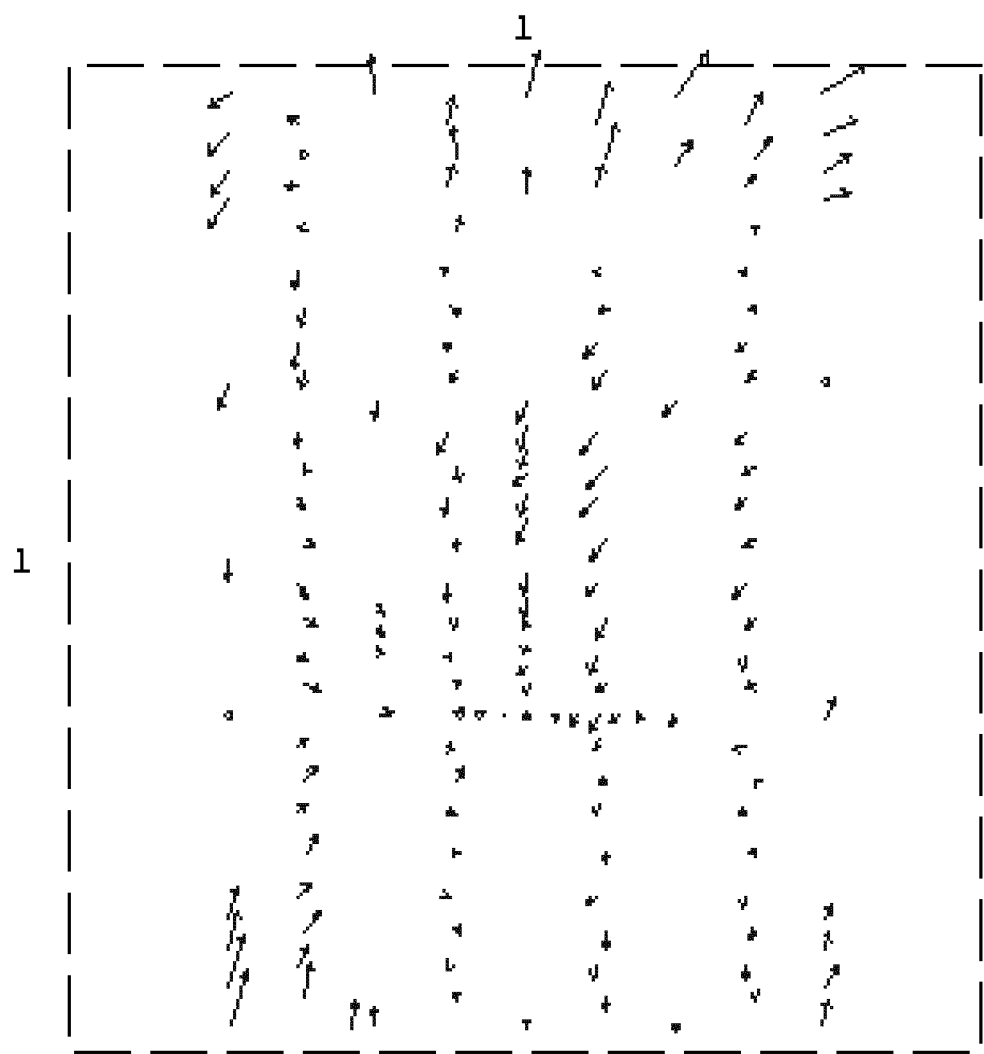

Up to now, the overlay targets are positioned in the scribe lines of the integrated circuits. FIG. 7 schematically presents a displacement vector map or a displacement vector field measured at overlay targets arranged in scribe lines of integrated circuits. The arrow tips of the individual vectors of the displacement vector field indicate the directions of the displacement of the respective positions of the second mask with respect to the first photolithographic mask. The lengths of the vectors denote the magnitude of the shift of the respective positions of the second mask relative to the first mask. It can be seen from FIG. 7 that the restriction of the placement of the overlay targets to the scribe lines results in an irregular distribution of the overlay measuring points across the wafer.

Figure 8:
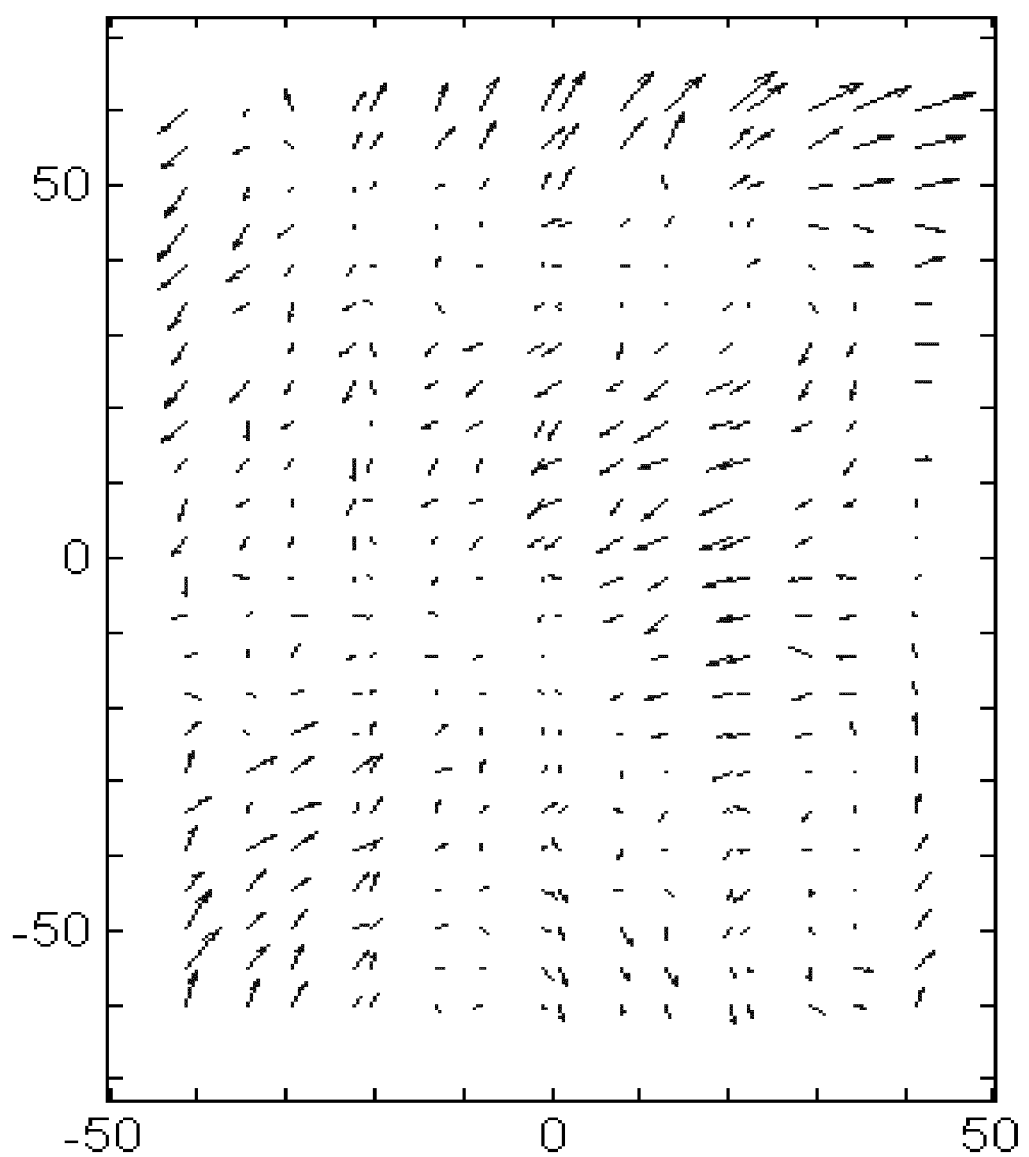

With shrinking sizes of the structures of integrated circuits and, on the other hand, increasing sizes of integrated circuits, it will no longer be sufficient to determine the overlay at the scribe line, but not on the die on the integrated circuit itself (in-die measurement). FIG. 8 schematically shows a grid of regular nodes of overlay measuring points where the nodes are arranged in the scribe lines as well as on the die area of the integrated circuit itself. This dense grid of overlay measuring points allows the determination of the overlay error with a high spatial resolution. A dense grid of overlay measuring points is a prerequisite for a beneficial application of the inventive method.

Now back to FIG. 6, the overlay error of the second $((m+1)^{th})$ mask relative to the first $(m^{th})$ mask can be measured by using the overlay metrology system 300 of FIG. 3 in order to determine a displacement vector field similar to FIG. 8. When the measured overlay error is below a predetermined threshold and the fabricated integrated circuit is at the end working properly, the first and the second masks can be used for the fabrication of the desired integrated circuit.

If the measured overlay error does not fulfil the predetermined specification, the projection device is readjusted in order to reduce the overlay error (box 645). After removing the photo resist from the wafer, a new layer of photo resist material is dispensed on the wafer (not shown in FIG. 6). Then, the overlay measurement is repeated (box 660). When the measured overlay error fulfils the requirement with respect to the predetermined overlay error, the first and the second masks are ready for being used for the production of the respective integrated circuit.

In case the overlay error is still too high, the overlay errors are analyzed based on measured displacement vectors as indicated in FIG. 8 in order to determine an arrangement of pixels for the second photolithographic mask (box 680). The writing of the arrangement of pixels with the laser source 435 of the apparatus 400 of FIG. 4 in the substrate of the second photolithographic mask shifts the pattern elements on the surface of the second photolithographic (box 690).

The writing of pixels can be limited to the active area of the photolithographic mask. The correction of pattern placement errors in the active area of the photolithographic masks is very effective, since the correcting pixels can be placed close to the error positions. On the other hand, when the writing of pixels is not restricted to the active area, the flexibility of the error correction process is enhanced. If the writing of the pixels can be limited to the non-active area, the introduction of new errors in the active area of the substrate of the photolithographic mask by the pixel writing process can be avoided. Since the distance between the pattern placement error and the correcting pixels may be large, the effectiveness of the correction process may be lower. This may partly be compensated as the writing of pixels does not have to consider a variation of the optical transmission.

After correcting of the second photolithographic mask, the wafer is prepared for a second illumination or exposure with the corrected second mask as described above. At the second illumination of the corrected second mask, its overlay error with respect to the first photolithographic mask is significantly reduced, so that the mask combination fulfils the predetermined overlay error.

In contrast to FIG. 2, the use case of a set of photolithographic masks according to FIG. 6 eliminates the necessity to send defective photolithographic masks from the wafer processing site to the mask fabrication site. Moreover, since the same metrology tool is used for the measurement of the overlay error and of the corrected photolithographic mask, tool related impacts on the measured data are avoided.

The following second section describes examples of the application of the inventive principle to double patterning lithography (DPL) processes. As already mentioned, in DPL the pitch size, which typically limits the patterning resolution, can be doubled for a pattern on a wafer compared to a single illumination or exposure. The inventive principle is in the following described in the context of DPL processes. However, it is recognized that the inventive principle can also be applied to lithography processes which use more than two photolithographic masks or more than two patterning processes for the generation of a pattern of a single layer on a wafer.

Figure 9:
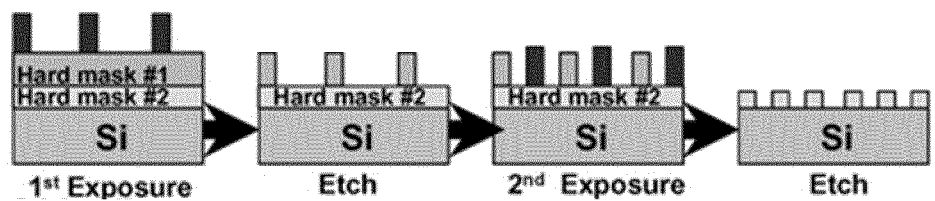
Figure 10:
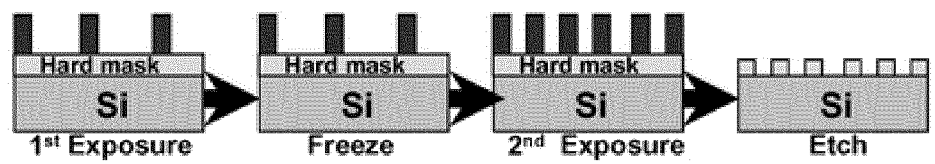
Figure 12:
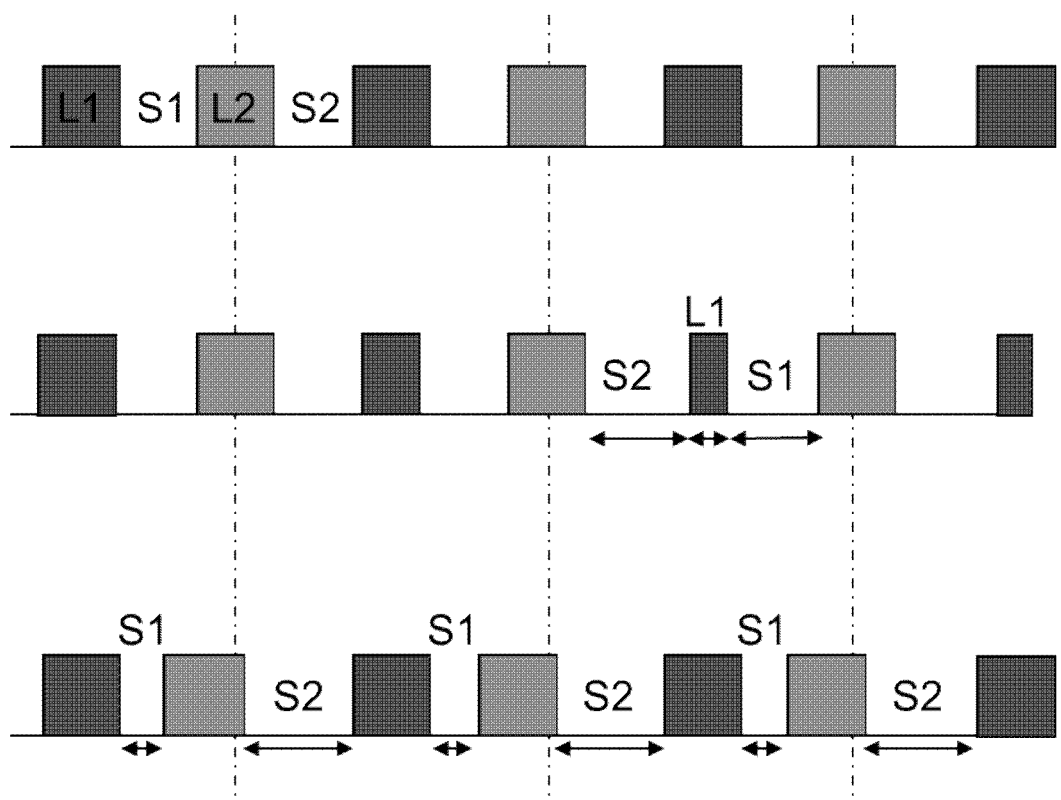

A first example describes the critical dimension uniformity (CDU) and overlay process control in litho-etch-litho-etch (LELE) and litho-freezelitho-etch (LFLE) DPL processes. FIG. 12 schematically depicts a cut of a cut-out of one-dimensional pattern generated with a LELE of LFLE process. As briefly discussed at the description of FIGS. 9 and 10, the first lithography and etch step generates the lines L1 (indicated in dark grey in FIG. 12). The second lines L2 (light grey rectangles in FIG. 12) are fabricated a in second litho-etch process. The combined DPL pattern results in lines L1 and L2 which are separated by a first space S1 between lines L1 and L2 and by a second space S2 between lines L2 and L1.

The upper row of lines and stripes of FIG. 12 shows a perfect form of the lines L1 and L2. Moreover, lines L1 and L2 are at their predetermined positions, and thus also automatically generating spaces S1 and S2 having an identical stripe width.

The middle part of FIG. 12 illustrates a situation in which the lines L2 have a perfect form and are located exactly at their predetermined position. On the other hand, the lines L1 also have their predetermined position but their width decreases in the example of FIG. 12 from left to right. The decreasing width of the lines L1 leads to a corresponding increase in the widths of the spaces S1 and S2. The decreasing width of the lines L1 results in CDU errors of lines L1 as well as of the spaces S1 and S2. These CDU errors can be corrected by introducing an arrangement of local persistent modifications in mask 1 which generates the pattern of lines L1 of the upper part of FIG. 12.

The CDU problem can be compensated by varying the optical transmission of mask 1 in the portion not having the CDU variation a in the range of up to some percent, i.e. by artificially decreasing the optical transmission of the defect free portions of mask 1. The portions of mask 1 having a local CDU variation are compensated by locally varying the portions of mask 1 with respect to the portion having the maximum CDU error (which is the left part or the middle row of FIG. 12). A respective increase the exposure dose of mask 1 by the projection system of the photolithographic exposure system corrects the CDU variation of mask 1 to a large extent.

The lower part of FIG. 12 presents perfect forms or shapes of lines L1 and also lines L2. However, in the cut-out of FIG. 12 the lines L2 are shifted with respect to their predetermined position which is indicated by the vertical dash dotted lines. The shift of lines L2 leads a smaller width of spaces S1 and to a broader width of spaces S2 compared the predetermined space widths illustrated in the upper part of FIG. 12. This results in CDU errors of spaces S1 and S2.

The CDU errors of spaces S1 and S2 are corrected by introducing at least one arrangement of local persistent modifications in mask 2 of the DPL process which compensates the local pattern placement error of the lines L2 of mask 2 in the cut-out of the line space pattern presented in FIG. 12.

If a line shape pattern shows the combined errors of the middle and the lower part of FIG. 12, these errors can also be corrected by introducing at least one respective arrangement local persistent modifications in mask 1 as well as in mask 2.

The CDU variation of mask 1 in the middle part of FIG. 2 and the local shift problem or the local overlay error of the lines L2 of mask 2 manifest in an overlay error in the DPL process. This means that a DPL process entangles local errors of the individual masks forming the combined pattern of a layer on a wafer to overlay errors of the pattern of the single layer. It is therefore mandatory to correct local errors of the individual masks of a DPL process in order to meet the tight overlay budget of technology nodes smaller than 32 nm.

As already mentioned, a prerequisite for the error correction or error compensation in DPL processes or generally in multiple patterning lithography (MPÜL) processes is a determination of the local errors with high resolution. In FIG. 3 a high resolution metrology tool has been presented which uses photons for the defect detection. In addition, a scanning electron microscope (SEM) as well as a scatterometry, a proliferometry, an atomic force microscope (AFM) or other metrology tool types can also be applied in order to detect local defects of photolithographic masks which manifest in printing errors on a wafer. Electrons in an electron beam can be focussed to a small spot, thus an SEM can resolve structures down to the nanometre range.

There are additional metrology technologies available which have a resolution in a sub-nanometer range. Most high resolution imaging technologies have a trade-off due to a high numerical aperture (NA), and are hence very limited in the depth of focus (DOF) and have limited imaging capabilities closed to the wafer surface. Consequently, such tools may have difficulties to perform the imaging of the top layer and of previous layer(s) that are expected to be aligned. The test mask method (serving both single and multiple patterning) is solving this issue in multiple surfaced layers while the other methods are limited to multiple patterning, where all layers of interest for the specific process step are placed in the same topographical surface.

As already mentioned, MPL processes comprise double, triple, quadruple, quintuple, etc. patterning lithography processes. Presently, DPL processes are preferred.

In order to provide the high resolution required for the fabrication of patterns of technology nodes smaller than 32 nm, in-die measurements are required on the wafer. The metrology tools discussed above can be utilized for this purpose. Furthermore, the high-resolution error determination by in-die measurements simultaneously provides an indication or sets a local flag at the position of the error correction by introducing at least one arrangement of local persistent modifications in the substrate of the respective photolithographic mask.

Figure 13:
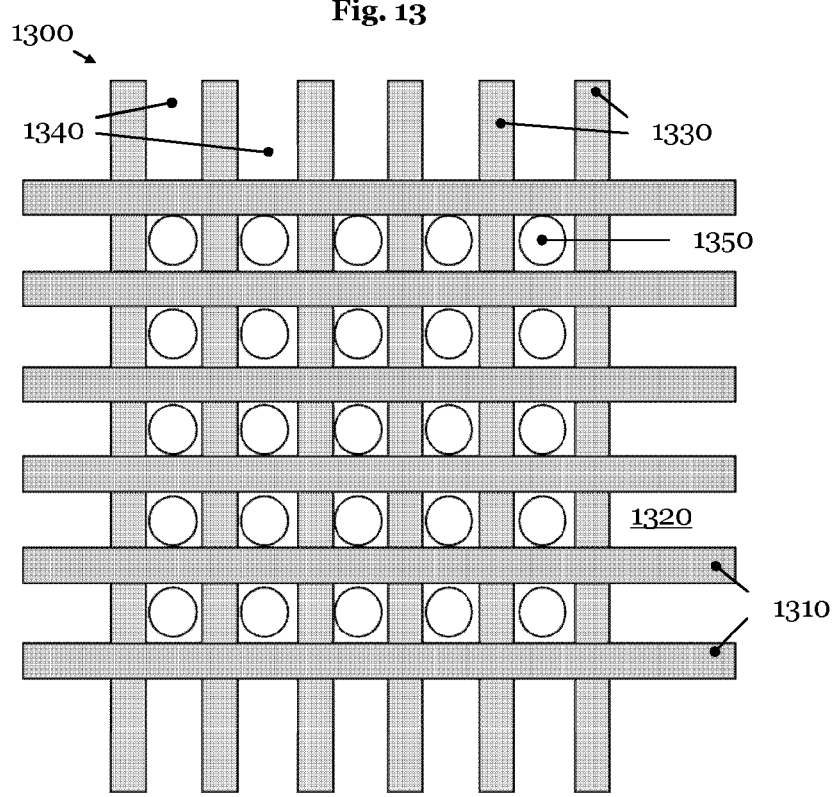

At the moment, the pitch size of a single exposure lithography process is limited to about 60 nm for lithography processes having a high uniform pattern. However, the fabrication of state of the art ICs requires a pitch size of less than 40 nm. FIG. 13 shows a two-dimensional (2D) pattern 1300 generated in a DPL process which can achieve pitch sizes of less than 40 nm in two vertical directions. The horizontal lines 1310 are a regular arrangement of lines separated by regular spaces 1320 which are generated by a first mask. The vertical lines 1330 are a regular arrangement of lines separated by regular spaces 1340 which are generated by a second mask in a LELE or an LFLE process. The circles 1350 symbolize schematically the designed shape and the predetermined location of an arbitrary pattern element which is used as a reference pattern element. Reference pattern elements 1355 having a form similar to the element 1350 are for example a contact hole (CH), a via, a memory capacitor, micro-electro mechanical system (MEMS) elements, or any other 2D and/or three-dimensional (3D) electronic device.

As will be seen in the following Figures, any deviation from the CDU specification will cause a distortion of the printed 2D pattern. Moreover, any local shift or displacement of the lines 1310 or 1330 of one of the first or the second mask also results in a distortion of the printed 2D pattern.

Figure 14:
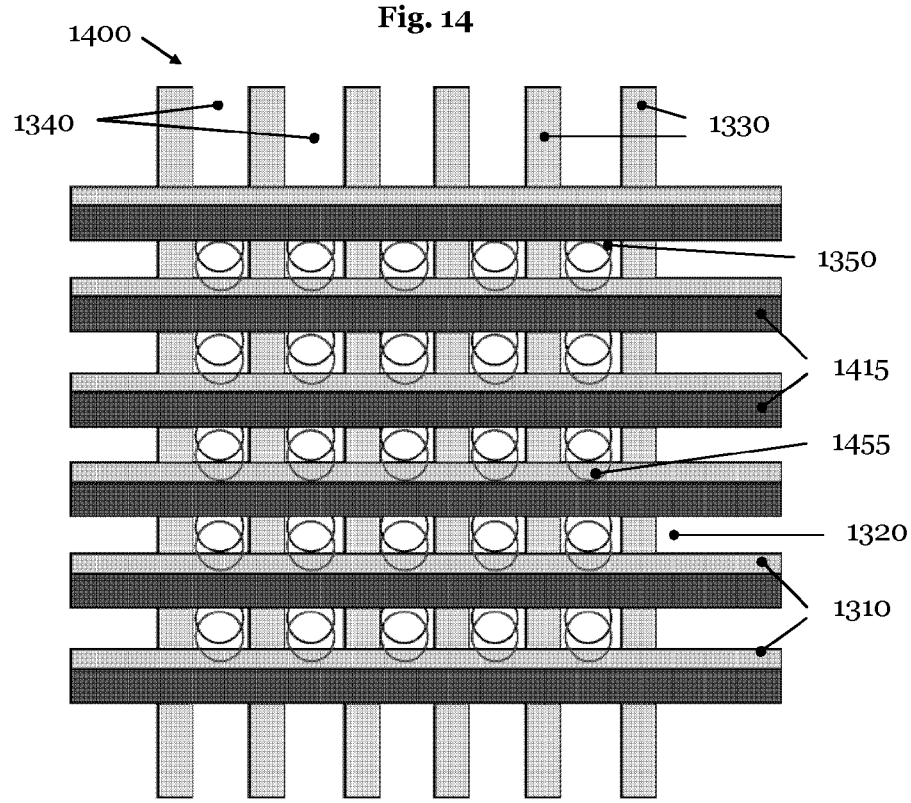

The diagram 1400 of FIG. 14 schematically illustrates the 2D pattern 1300 of FIG. 13, wherein the first mask which prints the horizontal lines 1310 has a local pattern placement problem or local overlay error with respect to a predetermined line position of the first mask. The displacement problem of FIG. 14 leads to the printing of lines 1415 instead of lines 1310. The displacement caused by a shift of lines 1415 is represented in the cut-out 1400 of FIG. 14 by a shift of the reference pattern elements 1350 of FIG. 13 in the vertical direction to a new position 1455 in FIG. 14. In essence, the overlay of printed (horizontal) lines 1415 will cause an overlay issue of the contact holes or any other 2D features, and the same goes for any shift in the vertical lines 1330.

The local shift of the reference pattern elements 1455 of FIG. 14 can be compensated by introducing local arrangement(s) of local persistent modifications in the first mask generating the horizontal lines 1415, and thus compensating the local shift of the horizontal lines 1415. The defect compensation will bring the lines 1415 in close agreement with the lines 1310 of FIG. 13, whereby the reference pattern elements 1455 are shifted to the positions of the reference pattern elements 1350. A global shift of all feature elements of the first mask can be compensated by a scaling and/or orthogonality correction of the scanner of the photolithographic exposure system.

FIG. 15 schematically represents a cut-out 1500 of the 2D pattern 1300 of FIG. 13, wherein the line width of the vertical lines 1535 increases from right to left. This is accompanied by a respective decrease of spaces 1545 between the vertical lines 1535. The inhomogeneous line width 1535 is caused by a critical dimension uniformity (CDU) variation of the pattern of the second mask used for the generation of the vertical lines 1535. As shown in FIG. 15, the reference pattern elements 1350 of FIG. 13 are deformed from cycles to ellipses 1555 and 1560, whereby their vertical half axes represents the varying space 1545 between the vertical lines 1535. It has here to be stressed that the elliptical deformation is just an example and that any deviation of a 2D or 3D structure from its original form can be used to detect a CDU variation.

The ellipses 1555 and 1560 schematically represent the impact of a local CDU variation on the finally printed 2D pattern distortion. The major and minor axes of the ellipses 1555 and 1560 can for example be measured with a SEM and this metric can be used to calculate the overlay error.

The overlay problem of FIG. 15 can be compensated by writing at least one arrangement of pixels in the substrate of the second mask which introduces a variation of the optical transmission in the second mask as discussed above in the context of FIG. 12.

Figure 16:
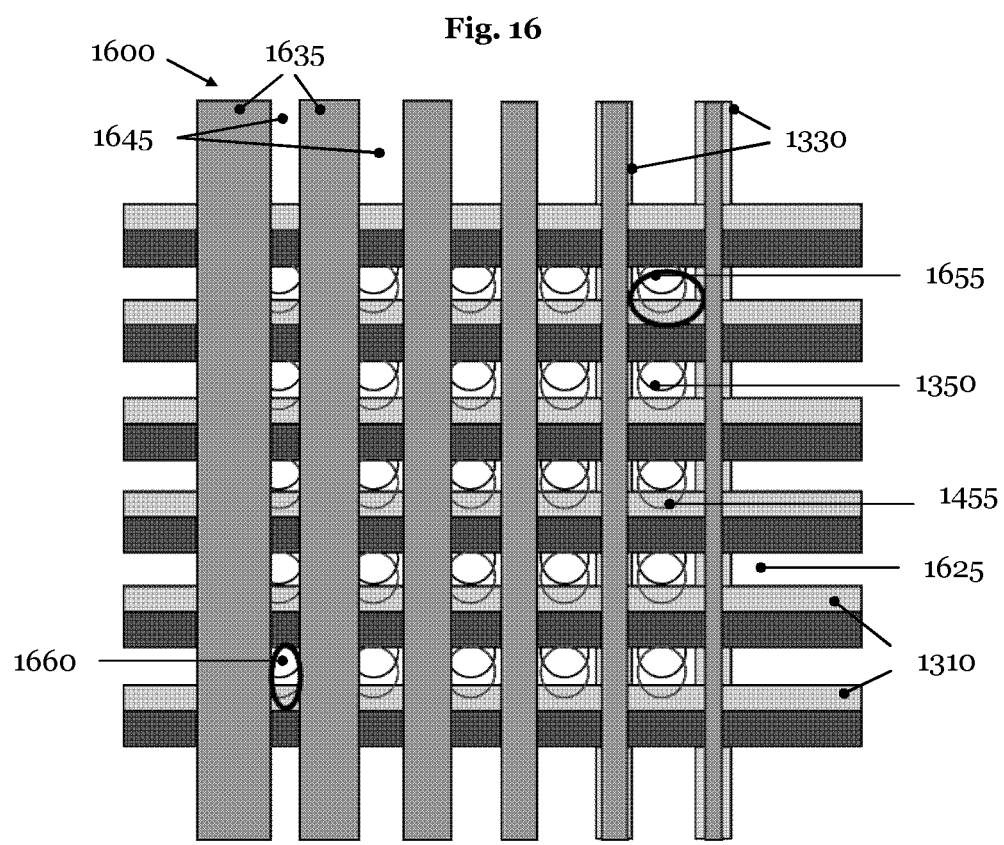
FIG. 16 represents FIG. 13, wherein the horizontal pattern has an overlay error and the vertical pattern has a critical dimension uniformity error.

The pattern cut-out 1600 of FIG. 16 shows the 2D pattern 1300 of FIG. 13 having a local shift in the horizontal lines 1615 of FIG. 14 relative to the ideal lines 1310 of FIG. 13. Furthermore, the vertical lines 1625 have the CDU error of FIG. 15. The shift and deformation of the reference pattern elements 1350 of FIG. 13 are indicated in FIG. 16 by the shifted ellipses 1655 and 1660. FIG. 17 depicts the enlarged ellipses 1655 and 1660 of FIG. 16.

The errors of the two masks are corrected as explained during the discussion of FIGS. 14 and 15. The shift as well as the dimensions of the major and the minor axes of the ellipses 1655 and 1660 can again be measured with a high-resolution metrology tool, as for example a SEM. Similar to FIG. 14, the local shift of the vertical lines 1615 can cause placement errors of the reference pattern elements 1350 which are for example contact holes (CHs). Additionally, it may lead to some distortion issues. The critical dimension (CD) non-uniformity will cause a CD distortion. Again analog to FIG. 15, the CDU error of the second mask used for the generation of the vertical pattern 1635 typically results in a distortion of the reference pattern elements 1350 as schematically indicated by the ellipses 1655 and 1660.

FIG. 18, which is taken from the paper "Towards 3 nm overlay and critical dimension uniformity: an integrated error budget for double patterning lithography" of W. A. Arnold mentioned in the second part, illustrates schematically some important process steps of a self-aligned double patterning (SADP) process. A layer 1820 to be etched or patterned is arranged on a wafer 1810. On top of the layer 1820 a so-called hard material photo resist of a sacrificial layer 1830 is deposited. The sacrificial layer 1830 is a photo resist or a hard mask layer and may comprise silicon nitride, silicon oxide, or any other appropriate material for this purpose or function. A photo resist layer 1840 is arranged on the sacrificial layer 18. The wafer 1810 is then exposed to a photolithographic mask which forms dense pattern elements 1850 and isolated pattern elements 1870. In the example of FIG. 18, the pattern elements 1850 and 1870 have a nominal width of 1855 or 1875, respectively. The actual widths 1860 and 1880 of the pattern elements 1850 and 1870 on the wafer 1810 are smaller than the nominal or predetermined width 1855 or 1875, respectively. The small widths 1860 and 1880 generated in the lithography step cause a CDU error in the layer 1820 to be etched.

Figure 11:
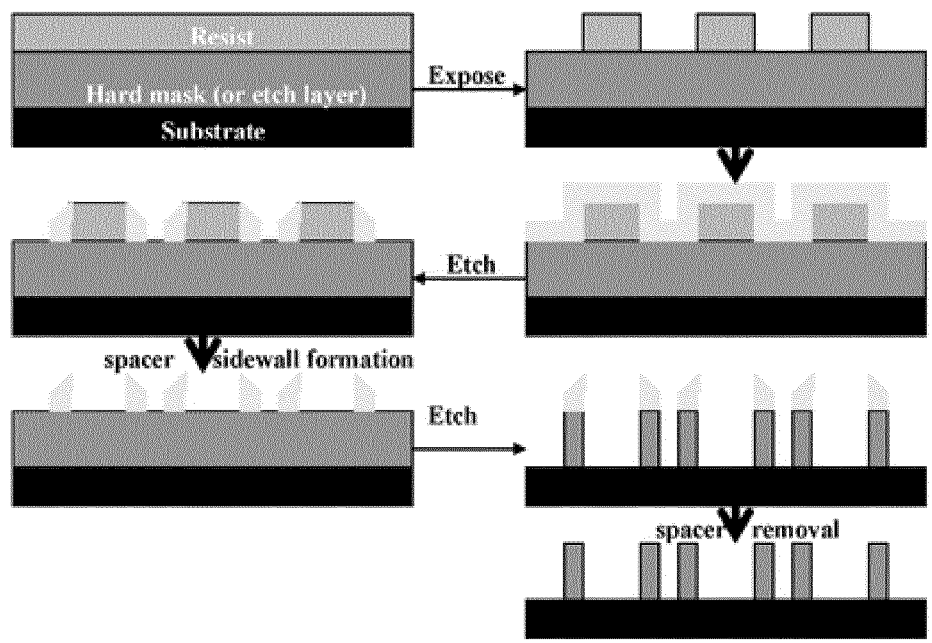

Further, the spacer deposition and the subsequent etching process (as indicated in FIG. 11) introduce a further variation in the spacer elements 1890 formed by the etching process. After the removal of the remaining photo resist 1840 and of the sacrificial layer 18, the pattern formed by the spacer elements 1890 is etched in the layer 1820, wherein the spacer elements 1890 act as etch stop elements. Finally, the spacer elements 1890 and the sacrificial layer portions below the spacer elements 1890 are removed from the generated pattern elements of the layer 1820.

In the etching process a variation of the lithography pattern 1850, 1870 or a CD error transforms in an error of the widths of the stripes S2 as can be seen in the lower part of FIG. 18. Furthermore, the etching process converts a variation of the spacer elements 1890 in a variation of the lines L1 and L2. A variation of the lines L1 and L2 also results in a variation of the spaces S1. Consequently, the pattern generated with the SADP process shows an overlay error; an effect which is known as "pitch walking".

The errors in the one-dimensional (1D) line space pattern of the SADP process can again be measured by using the metrology tool described in FIG. 3, by using for example a SEM and/or a scatterometer.

The defined method enables to correct the defects of the SADP pattern of FIG. 18. In a first step at least one arrangement of pixels is introduced or written in the photolithographic mask used for the generation of the pattern 1850 and 1870 in a lithography process. The arrangement(s) of pixels compensate the CDU variation by introducing a respective variation of the optical transmission in the substrate of the photolithographic mask. This process brings the spaces S2 in FIG. 18 in close agreement with the predetermined space.

In a second step, an arrangement of local persistent modifications is introduced in the sacrificial layer 1830. The local persistent modifications or the pixels in the sacrificial layer 1830 induce a structural change of the material of the sacrificial layer 1830 and thus avoiding a variation of the lines during the etching of the layer 1820. The modified sacrificial layer 1830 prevents "pitch walking" effects during the etching step of the layer 1820. As a consequence the lines L1 and L2 are generated having a uniform width. The pixels are written in the sacrificial layer 1830 prior to the deposition of the photo resist 1840. In case the sacrificial layer 1830 is placed wrong, it is also possible to apply a RegC process in order to correct the local as well as the wrong placement of the sacrificial layer 1830, while the scanner can correct only global (low frequency) overlay errors.

This means that a critical dimension non-uniformity (CDNU) in a sacrificial layer 1830 leads to overlay error in a SADP process. This error can be measured by conventional wafer fab metrology tools or systems such as but not limited to: CD SEM (critical dimension scanning electron microscope), AFM, scatterometry and/or profilometry. Then, the identified overlay error can be fixed by applying at least one arrangement of local persistent modifications in the sacrificial layer 1830 similar than described above for the substrate of a photolithographic mask.

In the following, a further example for the application of the inventive principle is presented. In this example, the at least one error on a wafer is measured with the aid of a test mask. For this purpose, a test mask is designed and created which has test features which are aligned with at least one mask used for the fabrication of ICs on a wafer. This mask is in the following also called a production mask. The test features are in-die test features in order to secure a high resolution at the error detection.

FIG. 19 schematically presents a test mask 1900 having a test pattern 1910. The actual test pattern 1910 of the test mask 1900 is designed by IC or device designers. It is also beneficial to consult optical proximity correaction (OPC) designers at the determination of the layout of the test pattern 1910 of the test mask 1900. The test pattern 1910 of FIG. 19 comprises dense pattern elements 1920, semi dense (or "denso") pattern elements 1930, and isolated pattern elements 1940.

The test mask 1900 is investigated in detail on mask level. Further, the pattern printed by the test mask 1900 on a wafer is also investigated with respect to CDU and pattern placement errors. Thus, the test mask 1900 can be regarded as a reference test mask which prints its pattern elements 1910 in a minimal and yet well mapped and documented CDU and pattern placement error.

The test mask 1900 is presently preferably applied in combination with a second mask or a production mask in a double patterning process. It is however appreciated that the test mask concept can also be applied in the fabrication process of a wafer using a single exposure lithography technology. In the following, the concept is discussed in the context of a DPL process.

In a first step, the test mask 1900 is exposed to a wafer. After the development of the exposed photo resist, the test pattern 1910 of the test mask 1900 is etched in the wafer. The combination of the exposure and etching process is also called printing of the test mask 1900. In the second step, the photolithographic mask used in the fabrication of a DPL layer on the wafer or a production mask is also printed on the wafer as described above for the test mask 1900.

Standard very large scale integration (VLSI) processes require a surface planarization in order to avoid a problem with the depth of focus (DOF) due to a non-planar surface topography of the photo resist on the wafer. The proposed method overcomes this challenge. In order to minimize deviations from a standard fabrication process, it is however advantageous to print the test mask 1900 on a thin layer with a high optical contrast to ease the metrology process, as this layer can be treated like a hard mask, for example a silicon nitride layer, and to perform a full lithography and etch process on the test mask followed by a printing process of the production mask used in the DPL process and then performing the overlay and CD measurements in-die on the wafer.

FIG. 20*a* schematically shows a test pattern 2010 arranged on the nitride layer 2020 of the wafer 2000. The test pattern 2010 has been generated in a first litho-etch (LE) process (right part of FIG. 20*a*). After performing an etching step and after applying a second photo resist 2030, the hard mask layer 2020 allows a minimal topography, i.e. is essentially flat. This is indicated in the left part of FIG. 20*a*. On the other hand, FIG. 20*b* illustrates an example wherein the wafer 2005 does not have a hard mask layer 2020, and the surface of the photo resist 2035 shows a distinct topography 2045. The topology can negatively affect both, the photolithography process and the metrology resolution, accuracy and precision. Therefore, it is recommended to us the method of FIG. 20*a*.

In the next step, the overlay error between the test mask 1900 and the production mask is measured. This can be performed by using the metrology tool described in FIG. 3, by using a SEM, and/or by using a scatterometer and/or by using additional image base or modeling base metrology methods. The overlay error map of the overall wafer is determined by stacking the relevant sampling fields of the individual exposures of the test mask 1900 and the production mask across the wafer.

The overlay errors on wafer level are then compensated by writing one or more arrangements of pixels in the substrate of the production mask. The process of printing and measuring of the test mask 1900 and the corrected production mask is then repeated in order to check whether the correction process by the writing of pixel arrangements has been successful.

The described procedure is performed for all overlay critical production masks in order to minimize the overall overlay error budget. It is in this process beneficial to include in the test pattern 1910 of the test mask 1900 pattern elements that allow checking of the patterns of as many as possible production masks. This procedure minimizes the cost of the test mask concept as only one or a very limited number of test masks 1900 are required. On the other hand, this procedure also reduces error introduced at the transition from a first test mask to a second test mask. This is shortly explaining with the aid of the following examples.

The first example describes the application of a single test mask 1900 for the control of several patterns of several layers of a wafer. Two layers, called A and B, are supposed to be the overlay critical layers. The patterns P of the layers A and B at the position i are called $PA_i$ and $PB_i$. A test pattern 1910 of a test mask 1900 has test pattern $TA_i$ and $TB_i$, wherein the test pattern $TA_i$ and $TB_i$ are close to each other. This allows the assumption that the placement error of the test pattern $TA_i$ and $TB_i$ are identical. This means that one test pattern $T_i$ can actually serve for the test of both pattern $PA_i$ and $PB_i$:

$$TA_i = TB_i = T_i \quad (1)$$

In a first step, the test mask 1900 and the mask or production mask for the layer A are printed by using a LELE or a LFLE process and the displacements of the pattern elements relative to the test pattern are measured:

$$\Delta A_i = PA_i - TA_i = PA_i - T_i \quad (2)$$

Then, the test mask 1900 and the production mask for the layer B of the wafer are printed in a LELE of LFLE process, and the resulting displacements between the test pattern 1910 and the pattern of mask B are determined:

$$\Delta B_i = PB_i - TB_i = PB_i - T_i \quad (3)$$

From the two measurements presented in equations 2 and 3 the relative displacements of the pattern elements $PA_i$ and $PB_i$ can be determined:

$$\Delta AB_i = PA_i - PB_i = \Delta A_i - T_i - (\Delta B_i - T_i) = \Delta A_i - \Delta B_i \quad (4)$$

As already mentioned, the relative location of the test pattern $TA_i$ and $TB_i$ can additionally be obtained from a detailed analysis of the test mask 1900 using one or more of the metrology tools described above.

In the following example, two test masks A and B are designed, wherein the test mask A comprises the test pattern $TA_i$ and the second test mask B comprises the test pattern $TB_i$. The test pattern of each test mask contains an alignment element AL, as for example an Archer alignment mask. It is again assumed that the test patterns $TA_i$ and $TB_i$ are close to the alignment AL, so that the placement error of the test patterns $TA_i$ and $TB_i$ relative to the respective alignment element AL can be neglected.

The test masks A and B are applied in order to check two overlay critical layers A and B of a wafer. For this purpose, a test print of the mask A is performed and the locations of the test pattern $TA_i$ are determined by using the alignment marks $ALA_i$:

$$TA_i = ALA_i - \Delta TA_i \quad (5)$$

Then, a test print of the mask B is performed and the locations of the test pattern $TB_i$ are determined by using the alignment marks $ALB_i$:

$$TB_i = ALB_i - \Delta TB_i \quad (6)$$

In a first LELE or LFLE process the test pattern $TA_i$ of the test mask A and the pattern $PA_i$ of the production mask A are printed. This results in displacements of the pattern elements $PA_i$ relative to the test pattern $TA_i$:

$$\Delta A_i = PA_i - TA_i = PA_i - (ALA_i + \Delta TA_i) = PA_i - ALA_i - \Delta TA_i \quad (7)$$

In a second print process the test pattern $TB_i$ of the test mask and the pattern $P_i$ of the production mask B are printed which leads to displacements of the pattern elements $PB_i$ relative to the test pattern $TB_i$ of test mask B:

$$\Delta B_i = PB_i - TB_i = PB_i - (ALB_i + \Delta TB_i) = PB_i - ALB_i - \Delta TB_i \quad (8)$$

From the two measurements the relative displacements $PA_i$ and $PB_i$ are known according to:

$$\Delta AB_i = PA_i - PB_i = \Delta A_i + (ALA_i + \Delta TA_i) - (\Delta B_i + (ALA_i + \Delta TA_i)) \quad (9)$$

wherein the terms in the brackets are determined from the test prints of the test masks A and B as described above.

A possible variation of the presented procedure is the design of the test pattern $TA_i$ and $TB_i$ that allow a measurement of their relative position. In this case, the alignment marks AL are redundant and can serve for further qualification purposes.

FIG. 21 schematically illustrates a field of a wafer layout after the test pattern 1910 of the test mask 1900 of FIG. 19 (dark grey elements) and a vertical pattern 2110 (light grey elements) of a production mask are printed in a LELE of an LFLE process. The production mask comprises dense vertical lines 2120, medium dense lines 2130 and one isolated line 2140. For the production mask of FIG. 21 only vertical lines of the test pattern 1910 of the test mask 1900 are relevant. The dense lines 2120 and the isolated line 2140 of the production mask pattern and of the test mask pattern 1910 are essentially aligned to each other, whereas the medium dense line 2130 has a local line space error 2150 with respect to the respective test pattern element of the test mask 1900. The detected local overlay error 2150 between the test pattern element and the vertical line pattern of FIG. 21 is caused by an in-die placement or registration error. It can be corrected by writing an arrangement of pixels in the range of the medium dense lines 2130 of the mask of FIG. 21 in order to compensate the defect of the production mask of FIG. 21.

FIG. 22 schematically presents the situation in which the test mask pattern 1910 of the test mask 1900 is printed in a litho-etch (LE) process. In a first step, a LE process of the LELE process the contact holes of a production mask are printed and etched. The contact holes (CHs) are indicated in FIG. 22 by cycles. Many thousands CHs are etched in a field of a layer of a wafer which forms a layer of a modern IC. Only five of them are important for a test of the CH arrangement by the test pattern 1910 of the test mask 1900. These are depicted in FIG. 22 by dark grey circles 2220, 2230, 2240, 2250, and 2260. Four small squares 1915 of the test pattern 1910 are used to check the placement of the CH arrangement.

As can be seen from FIG. 22, the four test CHs 2220, 2230, 2240, and 2250 are essentially at their predetermined position, whereas the CH 2260 is shifted with respect to its predetermined location. The placement error of the contact hole 2260 can be corrected by writing an arrangement of pixels in the range of the erroneous CH 2260, which shifts the CH 2260 essentially to its predetermined position. The in-die error determination provides an indication where to position the at least one arrangement of local persistent modifications used for the defect compensation. The expression "essentially" means here as well as on other positions within this description a positioning within the resolution limit of a state-of-the-art metrology tool.

Similar to FIGS. 21 and 22, FIG. 23 depicts a wafer pattern printed and etched with the test pattern 1910 of the test mask 1900 of FIG. 19 and a production mask having a horizontal line space pattern. For this use case, only the horizontal bars 1925, 1935 and 1945 of the test pattern 1910 are relevant and used for a check of the horizontal lines 2320 and 2330 of the production mask of FIG. 23. As can be seen from FIG. 23, the lines 2320 and 2330 of the production mask are simply vertically shifted relative to the test pattern elements 1925, 1935 and 1945. This means that the detected error is a global overlay error. As already explained at the discussion of FIG. 19, the test pattern 1910 of the test mask 1900 is investigated in great detail, so that the test pattern can be taken as a reference pattern. Thus, the shift detected between the test pattern elements 1925 and 1935 and the line 2320 and the test pattern element 1945 and the line 2330 can be attributed to a shift of the lines 2320 and 2330 of the production mask. Therefore, the test mask pattern 1910 can not only be used to detect local errors of a production mask, but can also be used analyze global overlay errors of a production mask.

The displacement error of the horizontal lines 2320 and 2330 of the mask of FIG. 23 detected by in-die measurements is compensated by a linear transformation (scaling and orthogonality correction) of the scanner used in the DPL process. This means that the test mask concept, which is based on in-die measurements, can also be used to correct global overlay errors, and thus minimizing the overlay error of overlay error tight DPL processes as well errors of single patterning processes where the overlay is measured between layers in different topographic planes on a wafer.

Alternatively, it is also possible to write arrangements of pixels in the mask of FIG. 23 in order to bring lines 2320 and 2330 in line with the test pattern elements 1925, 1935 and 1945.

FIG. 24 schematically presents a superposition of a field of a wafer layout of the three various layers of FIGS. 21 to 23. The corrective actions of the individual masks in order to minimize the overlay error of the various masks have been indicated at the discussion of the various layers. FIG. 25 schematically represents the superposition of the various layers of FIG. 24 after the errors of the individual errors have been corrected with respect to the corresponding pattern elements of the test pattern 1910 of the test mask 1900. As can be seen from FIG. 25, the overlay error of the layers of FIGS. 21 to 23 is minimized by the corrective actions of each mask.

The examples presented up to now refer to a single exposure of a mask on a wafer. However, a wafer layout comprises the subsequent exposure of a mask many times in order to cover the overall wafer area with the pattern of a mask in order to print a layer of an IC to be fabricated many times on the wafer. A single exposure of a mask in on a wafer is called a field. Thus, the error discussed up to now are in-field errors.

In the following, a data analysis for an overlay error determination and compensation on the wafer level is discussed. To be more precise, a method for the determination of a route mean square (RMS) overlay error across a wafer and its compensation is presented. FIG. 26 schematically represents a field 2600 of a single exposure or a multiple exposure as for example a double exposure of a mask. The field comprises three in-field metrology sites 2610, 2620 and 2630 at which the in-field overlay error is determined. It is important to emphasize that the above methods allow measurements of an in-die overlay metrology on real product features, and thus providing a unique opportunity to control the overlay of product features rather than test features that may or may not be correlative to the actual device features' overlay.

FIG. 27 schematically shows a wafer 2700 which is covered by fields 2720 of subsequent exposures of a photolithographic mask. In a LELE or LFLE process two masks are required for a single in-field exposure. Each of the fields 2600, 2720 on the wafer 2700 has the overlay in-field targets 2610, 2620 and 2630 of FIG. 26. As is indicated by the crossed overlay targets in FIG. 27, an area from a submillimeter range up to several millimeters from the edge 2710 of the wafer is excluded from the determination of the overlay error across the wafer 2700. This measure exdudes wafer edge bias effects at the determination of the overlay error at wafer level. Based on wafer fab experience, the edged die effect cannot be compensated by lithography processes and should therefore not taken into account while averaging metrology data of all fields as an input of RegC and CDC processes.

In the next step, the overlay error on field level measured at multiple points per field, three positions 2610, 2620 and 2630 are shown in FIG. 26. For the determination of the in-field overlay error one of the methods presented above can be used. The in-field measurement focuses on hot spots in the exposure area of a mask in order to have sufficient experimental data for a statistically significant in-field error determination. A full wafer or a field sampling can be used to create an average fieldlevel error based on averaging of each of the targets at the sampled fields.

The in-field overlay error map of the individual fields 2600, 2720 are then stacked. The mask is then corrected by writing at least one arrangement of pixels in the substrate of the mask. A new wafer is printed with the corrected mask based on average metrology of all wafer fields except for edge-affected fields and the correction process is applied on this average in order to achieve a minimal error across the wafer. The overlay error resulting from the corrected mask is measured on both, the in-field level and the wafer level in order to check the error compensation improvement.

It is important to note that the number of measurement points per field should be defined by the manufacturer of the device fabricated from the process wafer in order to optimize the trade-off between the correction efficiency and the metrology productivity as more measurement sites means more metrology time and higher cost of the end-product. The discussed methods are relevant to work with any given sampling plan of the device manufacturer.

FIG. 28, which is taken from an internet publication, presents an example of an overlay error map 2810 across a wafer 2800. In order to obtain the error contributions which cannot be compensated by a scaling or orthogonality (S/O) correction, these errors are removed from the overlay error map 2810 of FIG. 28. The resulting overlay error map 2900 is presented in FIG. 29. In the in-field error map 2900 of FIG. 29 three regions 2910, 2920 and 2930 can be identified as examples of areas in the field which have a systematic error.

FIG. 30 illustrates the remaining in-field error distribution 3010 of FIG. 29 after the systematic errors 2910, 2920 and 2930 have been corrected by introducing respective arrangements of local persistent modifications in the substrate of the photolithographic mask. The systematic errors 2910, 2920, and 2930 of the combined mask and lithography process, which result in an increase of the respective overlay error, are essentially removed.

The invention claimed is:

1. A method for correcting at least one overlay error on wafers processed by at least one photolithographic mask, the method comprising:
   a. measuring the at least one overlay error on a wafer at a wafer processing site;
   b. modifying a global overlay error of the at least one overlay error of the at least one photolithographic mask by a linear transformation; and
   c. modifying a local overlay error of the at least one overlay error of the at least one photolithographic mask by introducing at least one arrangement of local persistent modifications in the at least one photolithographic mask.

2. The method according to claim 1, wherein the at least one overlay error comprises at least one error of at least one of at least two photolithographic masks used in a multiple patterning lithography process.

3. The method according to claim 1, wherein measuring of the at least one error comprises measuring of the at least one error in the active area of a chip (in-die).

4. The method according to claim 3, wherein in-die measuring of the at least one overlay error comprises measuring of a shift of at least one two-dimensional, or at least one three-dimensional structure on a wafer, or measuring an ellipticity of at least one two-dimensional, or at least one three-dimensional structure with an imaging-based or a model-based metrology method.

5. The method according to claim 1, wherein the overlay error comprises at least one local overlay error of at least one first photolithographic mask and at least one second photolithographic mask, the method further comprising the step of:
   correcting the at least one local overlay error by introducing at least one arrangement of local persistent modifications in the at least one first photolithographic mask and/or in the at least second photolithographic mask so that the at least one overlay error is minimized.

6. The method according to claim 5, wherein correcting the at least one local overlay error comprises introducing at least one first arrangement of local persistent modifications in the at least one first photolithographic mask and/or introducing at least one second arrangement of local persistent modifications in the at least one second photolithographic mask.

7. The method according to claim 5, wherein the at least one overlay error comprises at least one critical dimension uniformity error of the first photolithographic mask and/or at least one pattern placement error of the second photolithographic mask in a multiple patterning lithography process.

8. The method according to claim 1, wherein measuring the at least one error on the wafer comprises:
   a. generating a test mask having a test pattern;
   b. printing and etching the test pattern of the test mask on the wafer;
   c. printing and etching a photolithographic mask pattern on the test pattern of the wafer; and
   d. determining the at least one error as a difference of at least one pattern element of the photolithographic mask and of the at least one respective test pattern element of the test mask.

9. The method according to claim 8, wherein printing and etching of the test mask and printing and etching of the photolithographic mask comprises a single patterning or a multiple patterning lithography process.

10. The method according to claim 8, further comprising the step of determining an overlay error from a shift of a plurality of test pattern elements of the test mask relative to pattern elements of the photolithographic mask used in the single or multiple patterning lithography process.

11. The method according to claim 1, further comprising the step of introducing the at least one arrangement of local persistent modifications in a sacrificial layer on the wafer used in a self-aligned double patterning process.

12. An apparatus for correcting at least one overlay error on wafers processed by at least one photolithographic mask, comprising:
   a. at least one metrology system located in a wafer processing site and/or in a mask shop and adapted to measure the at least one overlay error on a wafer;
   b. at least one computing means adapted to calculate parameters for at least two error correcting means based on the at least one overlay error;
   c. at least one first error correcting means adapted for modifying a local overlay error of the at least one overlay error by introducing at least one arrangement of local persistent modifications in the photolithographic mask by applying ultra-short light pulse; and
   d. at least one second error correcting means adapted for modifying a global overlay error of the at least one overlay error by performing a linear transformation.

13. The apparatus according to claim 12, wherein the apparatus is adapted to correct at least one overlay error on wafers processed by at least one photolithographic mask by:
   measuring the at least one overlay error on a wafer at a wafer processing site;
   modifying a global overlay error of the at least one overlay error of the at least one photolithographic mask by a linear transformation; and
   modifying a local overlay error of the at least one overlay error of the at least one photolithographic mask by introducing at least one arrangement of local persistent modifications in the at least one photolithographic mask.

14. The apparatus according to claim 12, wherein the at least one metrology system comprises an ultrahigh-precision stage, at least one laser source, or other light source and at least one charge-coupled device camera operating in the ultraviolet wavelength range, or a scanning electron microscope and/or a scatterometer, or an image-based or a model-based metrology system.

15. The apparatus according to claim 12, wherein the at least one overlay error comprises at least one error of at least one of at least two photolithographic masks used in a multiple patterning lithography process.

16. The apparatus according to claim 12, wherein the at least one overlay error comprises at least one error in the active area of a chip (in-die).

17. The apparatus according to claim 16, wherein the at least one metrology system is adapted to measure a shift of at least one two-dimensional, or at least one three-dimensional structure on a wafer, or measure an ellipticity of at least one two-dimensional, or at least one three-dimensional structure with an imaging-based or a model-based metrology method.

18. The apparatus according to claim 12, wherein the overlay error comprises at least one local overlay error of at least one first photolithographic mask and at least one second photolithographic mask, and the apparatus is adapted to correct the at least one local overlay error by introducing at least one arrangement of local persistent modifications in the at least one first photolithographic mask and/or in the at least second photolithographic mask so that the at least one overlay error is minimized.

19. The apparatus according to claim 18, wherein the apparatus is adapted to correct the at least one local overlay error by introducing at least one first arrangement of local persistent modifications in the at least one first photolithographic mask and/or introducing at least one second arrangement of local persistent modifications in the at least one second photolithographic mask.

\* \* \* \* \*

UNITED STATES PATENT AND TRADEMARK OFFICE
CERTIFICATE OF CORRECTION

PATENT NO.        : 9,436,080 B2
APPLICATION NO.   : 13/994556
DATED             : September 6, 2016
INVENTOR(S)       : Beyer et al.

It is certified that error appears in the above-identified patent and that said Letters Patent is hereby corrected as shown below:

In the Specification

Column 1
Line 58, delete "trans-parent" and insert -- transparent --

Column 3
Line 15, delete "(30 value)" and insert -- (3σ value) --
Line 22, delete "(30 value)" and insert -- (3σ value) --

Column 6
Line 25, delete "polynominal" and insert -- polynomial --

Column 9
Line 3, delete "photolithographis" and insert -- photolithographic --

Column 15
Line 14 (approx.), delete "3" and insert -- 330 --

Column 20
Line 41, delete "proliferometry," and insert -- profilometry, --

Column 22
Line 64, delete "18," and insert -- 1830, --

Column 23
Line 60, delete "correaction" and insert -- correction --

Signed and Sealed this
Twenty-seventh Day of December, 2016

Michelle K. Lee
*Director of the United States Patent and Trademark Office*

Column 25
Line 39 (approx.), delete "$\Delta AB_i = PA_i - PB_i = \Delta A_i - T_i - (\Delta B_i - T_i) = \Delta A_1 - \Delta B_i$"
and insert -- $\Delta AB_i = PA_i - PB_i = \Delta A_i - T_i - (\Delta B_i - T_i) = \Delta A_i - \Delta B_i$ --

Column 28
Line 15, delete "exdudes" and insert -- excludes --

In the Claims

Column 30
Line 21, in claim 21, delete "pulse;" and insert -- pulses; --